US010707868B2

(12) United States Patent
Koizumi et al.

(10) Patent No.: US 10,707,868 B2
(45) Date of Patent: Jul. 7, 2020

(54) PROXIMITY SENSOR AND METHOD

(71) Applicant: OMRON Corporation, Kyoto (JP)

(72) Inventors: Masayuki Koizumi, Nara (JP);
Minami Wazumi, Nara (JP); Yusuke Nakayama, Fukuchiyama (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/891,376

(22) Filed: Feb. 8, 2018

(65) Prior Publication Data
US 2018/0331684 A1    Nov. 15, 2018

(30) Foreign Application Priority Data

May 9, 2017    (JP) .................................. 2017-092906

(51) Int. Cl.
*H03K 17/95* (2006.01)
*G01D 5/20* (2006.01)

(52) U.S. Cl.
CPC ......... *H03K 17/9502* (2013.01); *G01D 5/202* (2013.01); *G01D 5/204* (2013.01); *H03K 17/9505* (2013.01); *H03K 17/9525* (2013.01)

(58) Field of Classification Search
None
See application file for complete search history.

(56) References Cited

U.S. PATENT DOCUMENTS

| 8,482,250 B2* | 7/2013 | Soar | H01F 38/14 320/109 |
|---|---|---|---|
| 2009/0189600 A1* | 7/2009 | Kurkovskiy | G01D 5/2013 324/207.16 |
| 2010/0201355 A1* | 8/2010 | Yamaguchi | G01R 33/0029 324/228 |

(Continued)

FOREIGN PATENT DOCUMENTS

| EP | 2204908 | 7/2010 |
|---|---|---|
| JP | 2009059528 | 3/2009 |

(Continued)

OTHER PUBLICATIONS

Office Action of Korean Counterpart Application, with English translation thereof, dated Feb. 22, 2019, pp. 1-10.

(Continued)

*Primary Examiner* — Paresh Patel
(74) *Attorney, Agent, or Firm* — JCIPRNET

(57) ABSTRACT

A proximity sensor includes a transmission circuit that supplies a current to each of detection coils, a reception circuit that detects voltages generated at both ends of the coils or currents flowing in the coils due to the supply of the current for each of the coils, a control unit that senses the presence or position of a detection object using a detection result of the reception circuit, and an output unit that outputs a sensing result of the control unit. The control unit extracts a first component caused by a mounting fitting for mounting the proximity sensor on a support member and a second component caused by the detection object from the detection (Continued)

result of the reception circuit. The control unit compensates the second component using the first component. The control unit senses the presence or position of the detection object on the basis of the compensated second component.

12 Claims, 22 Drawing Sheets

(56) References Cited

U.S. PATENT DOCUMENTS

| | | | | |
|---|---|---|---|---|
| 2016/0363463 A1* | 12/2016 | Niwa | ................ | G01D 3/08 |
| 2017/0052633 A1* | 2/2017 | Kurobe | ............ | H03K 17/9502 |
| 2017/0302273 A1* | 10/2017 | Kantor | .............. | H03K 17/9505 |
| 2018/0017695 A1* | 1/2018 | Wang | .................. | G01D 5/202 |

FOREIGN PATENT DOCUMENTS

| | | | |
|---|---|---|---|
| JP | 2010-027611 | 2/2010 | |
| JP | 2010181300 | 8/2010 | |
| JP | 2015161532 | 9/2015 | |
| WO | WO-2016207604 A1 * | 12/2016 | ......... G01N 29/2475 |

OTHER PUBLICATIONS

"Office Action of Korea Counterpart Application", dated Aug. 24, 2019, with English translation thereof, p. 1-p. 12.

* cited by examiner

| | Time series | | | |
|---|---|---|---|---|
| | t1 | t2 | ... | tN |
| Coil 11 | Va(1) | Va(2) | ... | Va(N) |
| Coil 12 | Vb(1) | Vb(2) | ... | Vb(N) |

PROXIMITY SENSOR AND METHOD

CROSS-REFERENCE TO RELATED APPLICATION

This application claims the priority benefit of Japan patent application serial no. 2017-092906, filed on May 9, 2017. The entirety of the above-mentioned patent application is hereby incorporated by reference herein and made a part of this specification.

BACKGROUND

Technical Field

The present disclosure relates to a proximity sensor and a method executed by the proximity sensor, and particularly to an inductive proximity sensor and a method executed by the inductive proximity sensor.

Description of Related Art

A proximity sensor (an inductive proximity sensor) that senses the presence or position of a metallic detection object by using a magnetic field is known. If such a proximity sensor is set to have high detection sensitivity, the sensor reacts to a mounting metal fitting for mounting the proximity sensor on a device. Thus, it is not good to set detection sensitivity of the proximity sensor to be very high. As a result, it is not favorable to set a detection distance of the proximity sensor to be long.

Patent Documents 1 and 2 disclose technologies for reducing such influence of a mounting metal fitting. In the proximity sensor disclosed in Patent Document 1, the core of a sensor coil is surrounded by a metal layer (a coating) having an electric resistivity lower than 15 μΩ·cm and a thickness smaller than 40 μm in a radial direction of the core in order to improve a fitting property of the sensor with respect to a metal mounting plate (a mounting metal fitting) (refer to [Abstract]).

Patent Document 2 discloses a proximity sensor having a first coil and a second coil. The proximity sensor acquires values corresponding to a Q value of the first coil and a Q value of the second coil from a table and compares the values with a threshold value to determine presence of a detection object.

[Patent Document 1] Japanese Laid-open No. 2010-27611
[Patent Document 1] The specification of European patent application publication No. 2204908A2

The proximity sensor disclosed in Patent Document 1 does not reduce influence of the mounting metal fitting using a function of a control unit, but reduces influence of the mounting metal fitting using a metallic film to determine a distance. However, an effect of this method is limited to mounting metal fittings made of a specific material.

In the method used in Patent Document 2 in which Q values of coils are focused on, the Q values are elements each having great variations and significantly fluctuate due to a change in a resistance value of the coils caused by a change of a temperature in the periphery of the sensor, and thus it is difficult to construct a practical sensor that is strong against changes including those made in sensor-surrounding environments excluding the mounting metal fitting.

The present disclosure takes the above-described problem into consideration, and aims to provide an inductive proximity sensor that can reduce influence of a mounting metal fitting using a technique different from that of the related art, and a method executed by the inductive proximity sensor.

SUMMARY

According to an embodiment of the present disclosure, a proximity sensor senses the presence or position of a detection object using magnetic field in a state in which the proximity sensor is mounted on a support member using a mounting metal fitting. The proximity sensor includes a plurality of detection coils for generating the magnetic field, a transmission circuit that supplies a current to each of the detection coils, a reception circuit that detects voltages generated at both ends of the detection coils or currents flowing in the detection coils due to the supply of the current for each of the detection coils, a control unit that senses the presence or position of the detection object using a detection result of the reception circuit, and an output unit that outputs a sensing result of the control unit. The control unit extracts a first component caused by the mounting metal fitting and a second component caused by the detection object from the detection result of the reception circuit. The control unit compensates the second component using the first component. The control unit senses the presence or position of the detection object on the basis of the compensated second component.

According to another embodiment of the present disclosure, a method is executed by a proximity sensor that senses the presence or position of a detection object using magnetic field. The method includes a step of supplying currents to a plurality of detection coils for generating magnetic field, a step of detecting voltages generated at both ends of the detection coils or currents flowing in the detection coils due to the supply of the current for each of the detection coils, a step of sensing the presence or position of the detection object by using a detection result obtained in the step of detection, and a step of outputting a sensing result obtained in the step of sensing. The step of sensing the presence or position of the detection object includes a step of extracting a first component caused by a mounting metal fitting for mounting the proximity sensor on a support member and a second component caused by the detection object from the detection result obtained in the step of detection, a step of compensating the second component by using the first component, and a step of sensing the presence or position of the detection object on the basis of the compensated second component.

DESCRIPTION OF THE EMBODIMENTS

Figure 1:
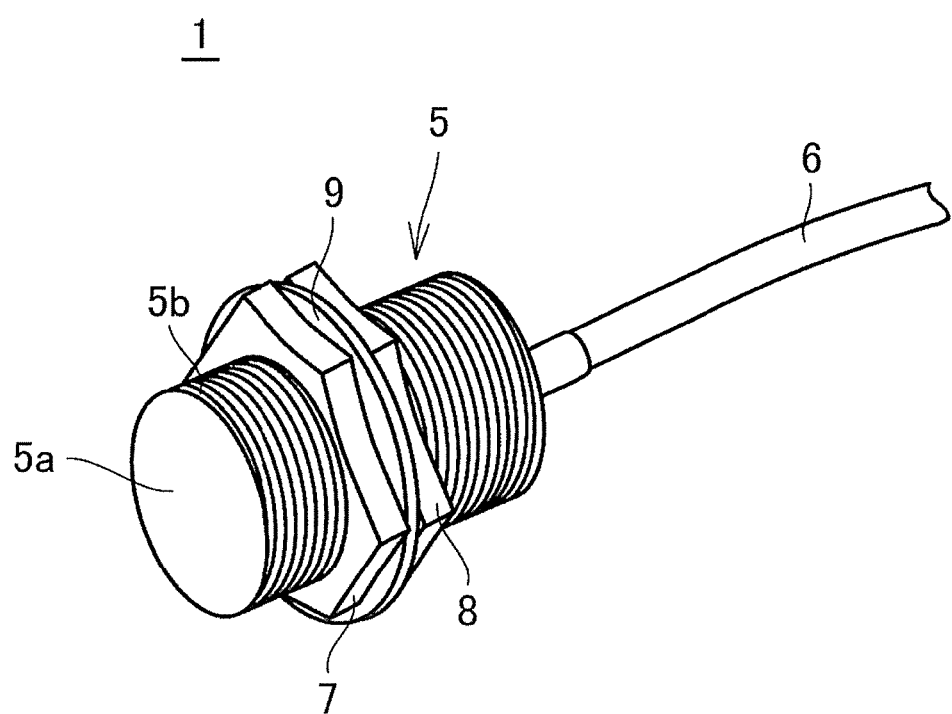
FIG. 1 is a perspective diagram of a proximity sensor.

According to an embodiment of the present disclosure, a proximity sensor senses the presence or position of a detection object using magnetic fields in a state in which the proximity sensor is mounted on a support member using a mounting metal fitting. The proximity sensor includes a plurality of detection coils for generating the magnetic fields, a transmission circuit that supplies a current to each of the detection coils, a reception circuit that detects voltages generated at both ends of the detection coils or currents flowing in the detection coils due to the supply of the current for each of the detection coils, a control unit that senses the presence or position of the detection object using a detection result of the reception circuit, and an output unit that outputs a sensing result of the control unit. The control unit extracts a first component caused by the mounting metal fitting and a second component caused by the detection object from the detection result of the reception circuit. The control unit compensates the second component using the first component. The control unit senses the presence or position of the detection object on the basis of the compensated second component.

In one embodiment, the control unit compensates the second component by subtracting the first component from the second component.

In one embodiment, the reception circuit detects the voltages or the currents for each of the detection coils individually.

In one embodiment, the reception circuit detects the voltages or the currents from each of the detection coils at different timings in a time dividing manner.

In one embodiment, the reception circuit has a plurality of processing systems each corresponding to the detection coils. The processing systems each acquire the voltages or the currents from the detection coils corresponding to the processing systems.

In one embodiment, the transmission circuit includes an excitation circuit for periodically supplying a pulsed exciting current to each of the detection coils. The plurality of detection coils include a first detection coil and a second detection coil. The second component is an integration value of transient currents generated at both ends of the first detection coil. The first component is a value based on an integration value of transient currents generated at both ends of the second detection coil and time constant information of transient currents generated at both ends of the second detection coil.

In one embodiment, the first detection coil and the second detection coil are annular coils. The first detection coil is installed in an inner region of the second detection coil.

According to another embodiment of the present disclosure, a method is executed by a proximity sensor that senses the presence or position of a detection object using magnetic field. The method includes a step of supplying currents to a plurality of detection coils for generating magnetic field, a step of detecting voltages generated at both ends of the detection coils or currents flowing in the detection coils due to the supply of the current for each of the detection coils, a step of sensing the presence or position of the detection object by using a detection result obtained in the step of detection, and a step of outputting a sensing result obtained in the step of sensing. The step of sensing the presence or position of the detection object includes a step of extracting a first component caused by a mounting metal fitting for mounting the proximity sensor on a support member and a second component caused by the detection object from the detection result obtained in the step of detection, a step of compensating the second component by using the first component, and a step of sensing the presence or position of the detection object on the basis of the compensated second component.

According to the embodiments of the above-described disclosure, influence of mounting metal fittings can be reduced.

Embodiments of the present disclosure will be described below with reference to the drawings. The same reference numerals will be given to the same constituent components in the following description. Names and functions thereof are the same as well. Thus, detailed description thereof will not be repeated.

First Embodiment

In the present embodiment, a pulse excitation proximity sensor among proximity sensors (inductive proximity sensors) that senses the presence or position of a metallic detection object using magnetic fields will be described.

A. Sensor Structure

FIG. 1 is a perspective diagram of a proximity sensor 1. Referring to FIG. 1, the proximity sensor 1 includes a body part 5, a lead wire 6 connected to the body part 5, nuts 7 and 8, and a washer 9 disposed between the nuts 7 and 8. Note that, although the body part 5 has a cylinder shape in this example, the disclosure is not limited thereto.

The body part 5 has a circular detection face 5a and a barrel-shaped housing 5b. A surface of the housing 5b has thread grooves for the nuts 7 and 8. Note that the detection face 5a is a part of a cap fitted into the housing 5b.

The nuts 7 and 8 and the washer 9 are used to attach the proximity sensor 1 to a support member such as a device. For example, the body part 5 can be fixed to a support member by inserting a part of a mounting metal fitting (e.g., an L-shaped fitting) between the nuts 7 and 8.

The proximity sensor 1 may not necessarily be fixed to a mounting metal fitting using the nuts 7 and 8 and the washer 9. In that case, the proximity sensor 1 may not include the nuts 7 and 8 and the washer 9.

As an example, a configuration in which the body part 5 is fixed to a support member by fitting the body part 5 into a metallic fitting member (a mounting metal fitting) without the nuts 7 and 8 and the washer 9 will be described below.

Figure 2:
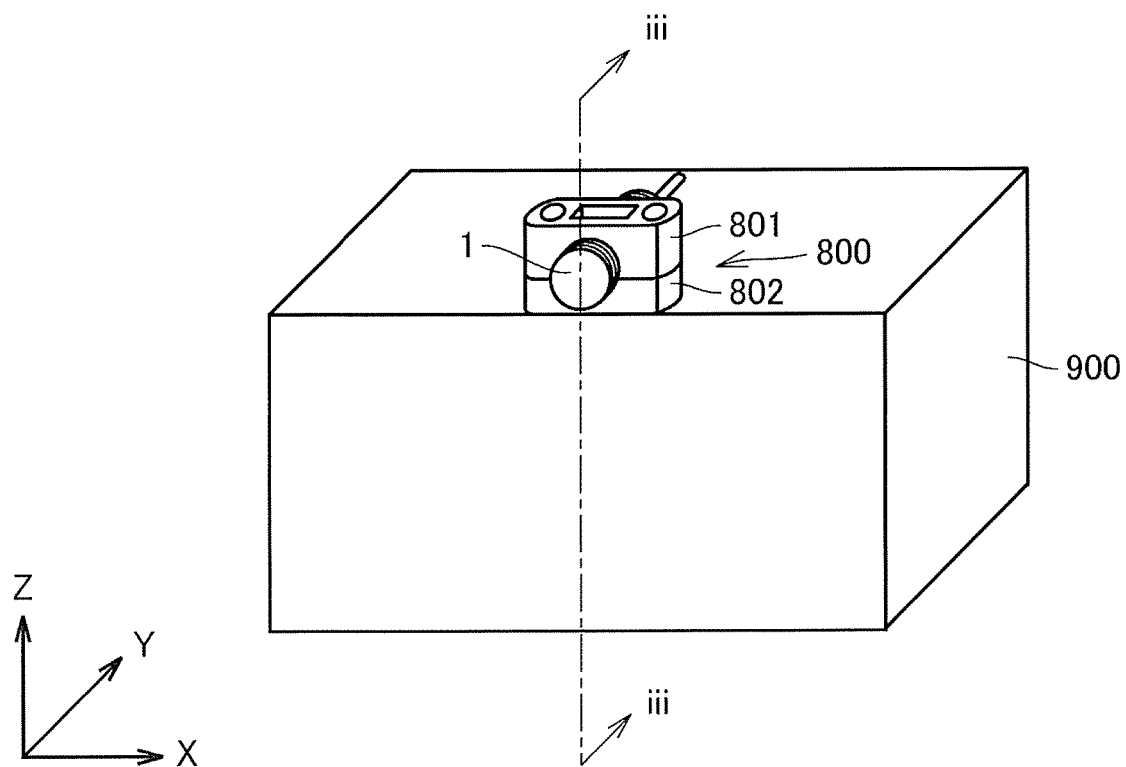
FIG. 2 is a diagram showing an example of installation of the proximity sensor.

FIG. 2 is a diagram showing an example of installation of the proximity sensor 1. Referring to FIG. 2, the proximity sensor 1 is mounted on a support member 900 using a mounting metal fitting 800.

The mounting metal fitting 800 has an upper housing 801 and a lower housing 802. The upper housing 801 and the lower housing 802 are fixed to the support member 900 by two screws which are not illustrated in the drawing. Since such a configuration of the mounting metal fitting 800 is known, detailed description thereof will not be provided.

Note that the mounting metal fitting 800 is an example of a mounting metal fitting for mounting the proximity sensor 1 on the support member 900, and is not limited to the above-described structure.

Figure 3:
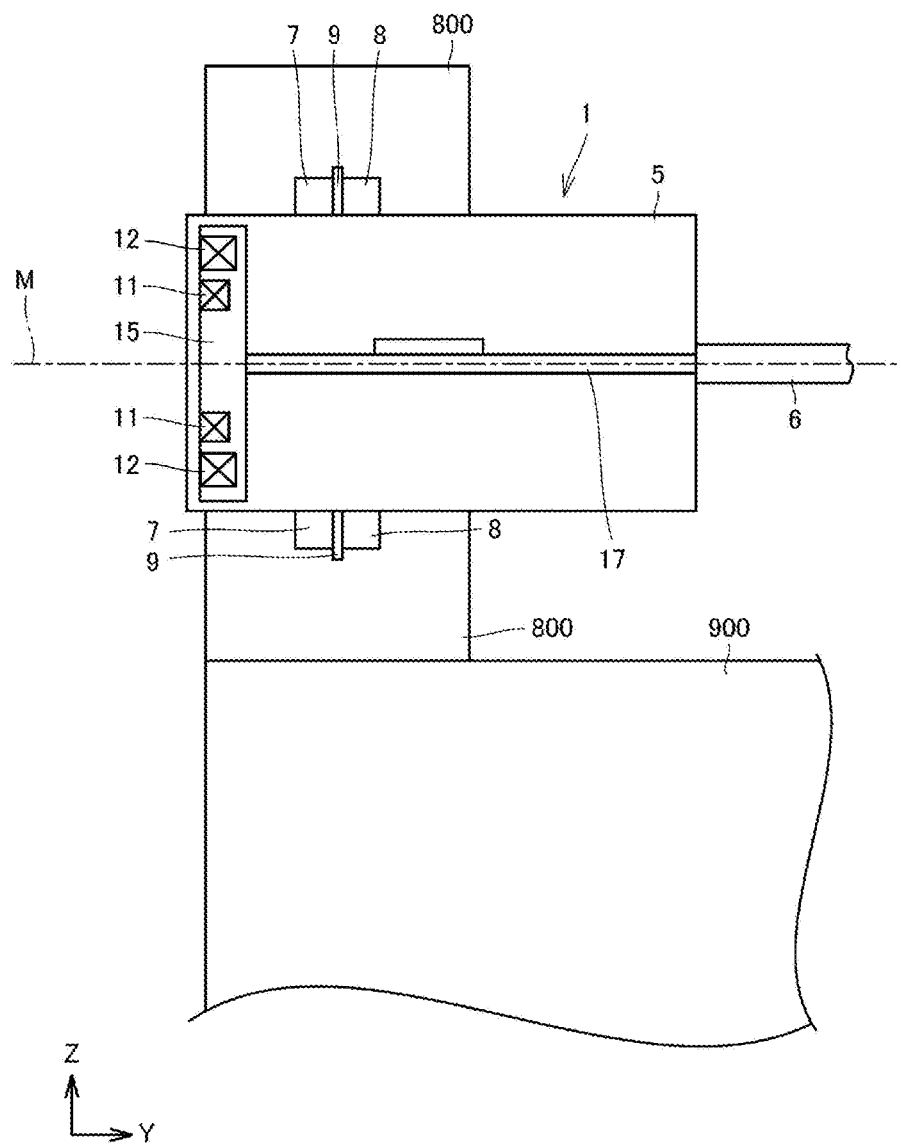
FIG. 3 is a cross-sectional diagram viewed along the line arrow iii-iii of FIG. 2.

FIG. 3 is a cross-sectional diagram viewed along the line arrow iii-iii of FIG. 2. Referring to FIG. 3, the body part 5 has detection coils 11 and 12, a ferrite core 15, an electronic circuit 17 (a hybrid IC) in which elements are disposed on a substrate, and an operation indication light that is not illustrated in the drawing. The body part 5 is filled with a resin. Note that the proximity sensor 1 may not include the ferrite core 15.

The coils 11 and 12 are annular coils. The coil 12 has a greater diameter than the coil 11. The coil 11 is installed in an inner region of the coil 12. In the present example, the coil 11 and the coil 12 are disposed to have a concentric circle shape. Note that the center of the concentric circle is positioned on a center axis M of the body part 5.

The coils 11 and 12 are electrically connected to the electronic circuit 17. The electronic circuit 17 receives power supply by the lead wire 6 and is electrically connected to an external electric device.

Figure 4:
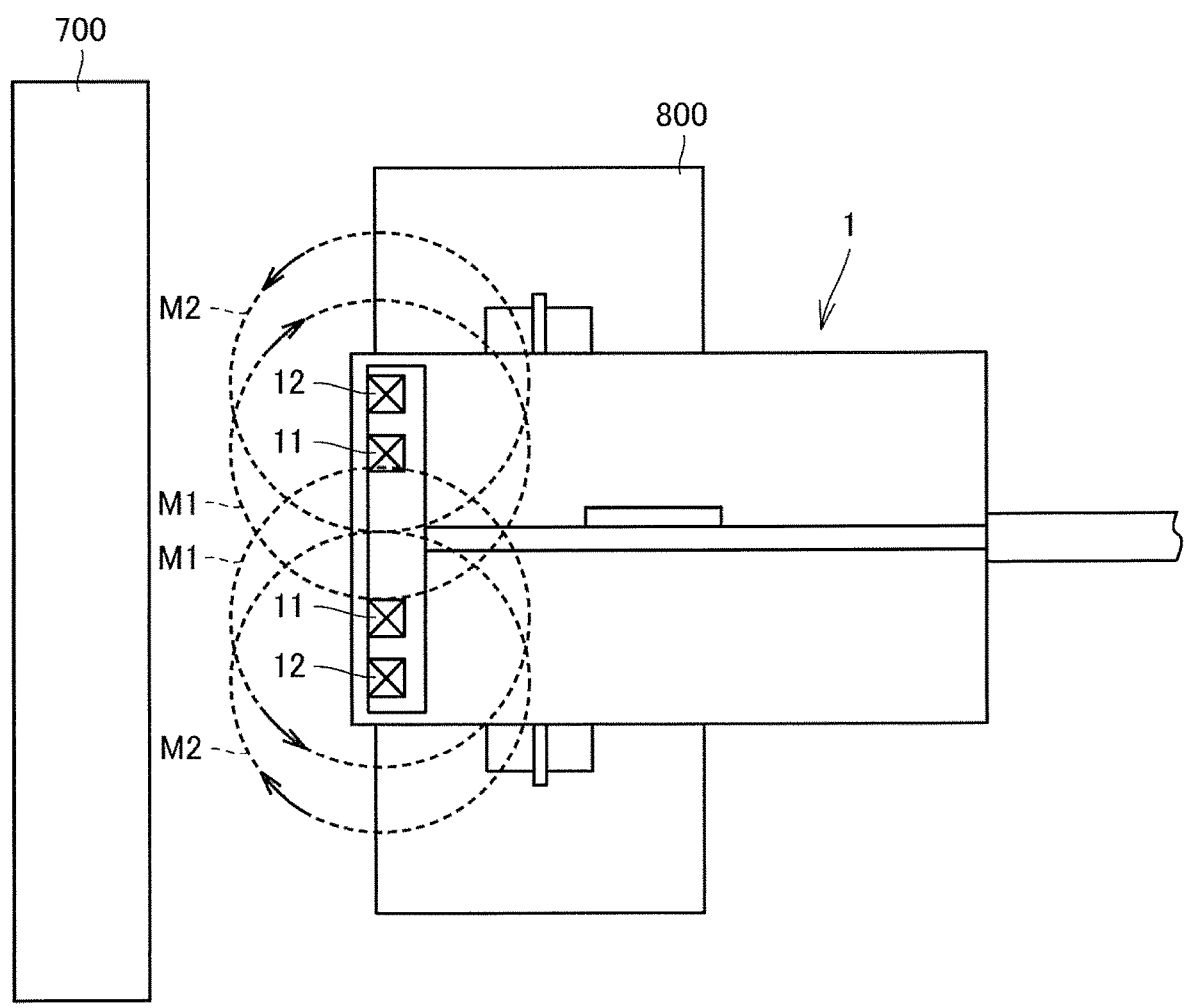
FIG. 4 is a diagram showing high frequency magnetic fields generated by coils.

FIG. 4 is a diagram showing high frequency magnetic fields generated by the coils 11 and 12. As shown in FIG. 4, when an exciting current flows in the coil 11, a high frequency magnetic field M1 is generated in the arrow direction. In addition, when an exciting current flows in the coil 12, a high frequency magnetic field M2 is generated in the arrow direction.

When the high frequency magnetic fields M1 and M2 are generated by the exciting currents flowing in the coils 11 and 12, an eddy current (an inductive current) flows in a detection object 700. This eddy current causes induced voltages (transient signals) at both ends of the coil 11 and both ends of the coil 12. The proximity sensor 1 detects these induced voltages by using a reception circuit 42. Accordingly, a CPU 59 of the proximity sensor 1 senses the presence of the detection object 700. Note that the disclosure is not limited thereto, and the proximity sensor 1 may sense a position of the detection object.

When an open magnetic path of the coil 12 is open in its outer circumferential direction, a range of magnetic coupling with the mounting metal fitting 800 is widened, and eddy currents flow within the mounting metal fitting 800 in a plurality of directions. This causes an interaction with the mounting metal fitting 800 to be complicated. In order to simplify the phenomenon and improve compensation accuracy, a structure in which the open magnetic path of the coil 12 is limited to a direction in which the open magnetic path gets close to the detection object 700 is more preferable.

Figure 5:
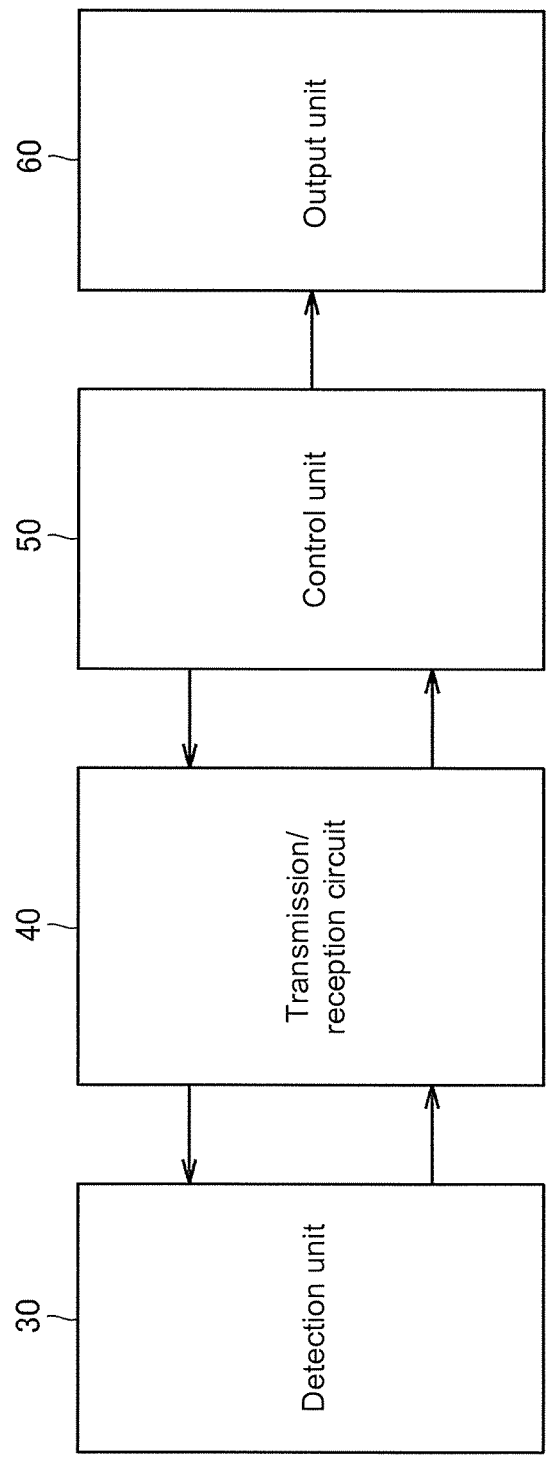
FIG. 5 is a block diagram for describing a schematic configuration of the proximity sensor.

FIG. 5 is a circuit block diagram for describing a schematic configuration of the proximity sensor 1. Referring to FIG. 5, the proximity sensor 1 includes a detection unit 30, a transmission/reception circuit 40, a control unit 50, and an output unit 60. The transmission/reception circuit 40, the control unit 50, and the output unit 60 are realized by the electronic circuit 17.

The control unit 50 controls overall operations of the proximity sensor 1. The control unit 50 transmits a control signal for controlling a timing of excitation to the transmission/reception circuit 40.

The transmission/reception circuit 40 generates a pulsed current (an exciting current) on the basis of the control signal, and outputs the current to the detection unit 30. The transmission/reception circuit 40 detects a voltage or a current generated in the detection unit 30 by supplying and blocking the exciting current. The transmission/reception circuit 40 outputs the detection result to the control unit 50.

The control unit 50 performs calculation, which will be described below, on the detection result (a signal) output from the transmission/reception circuit 40, and outputs the calculation result (a signal) to the output unit 60.

The output unit 60 transmits the signal (the sensing result) transmitted from the control unit 50 to an electronic device that is a connection source of the proximity sensor 1 through the lead wire 6.

Figure 6:
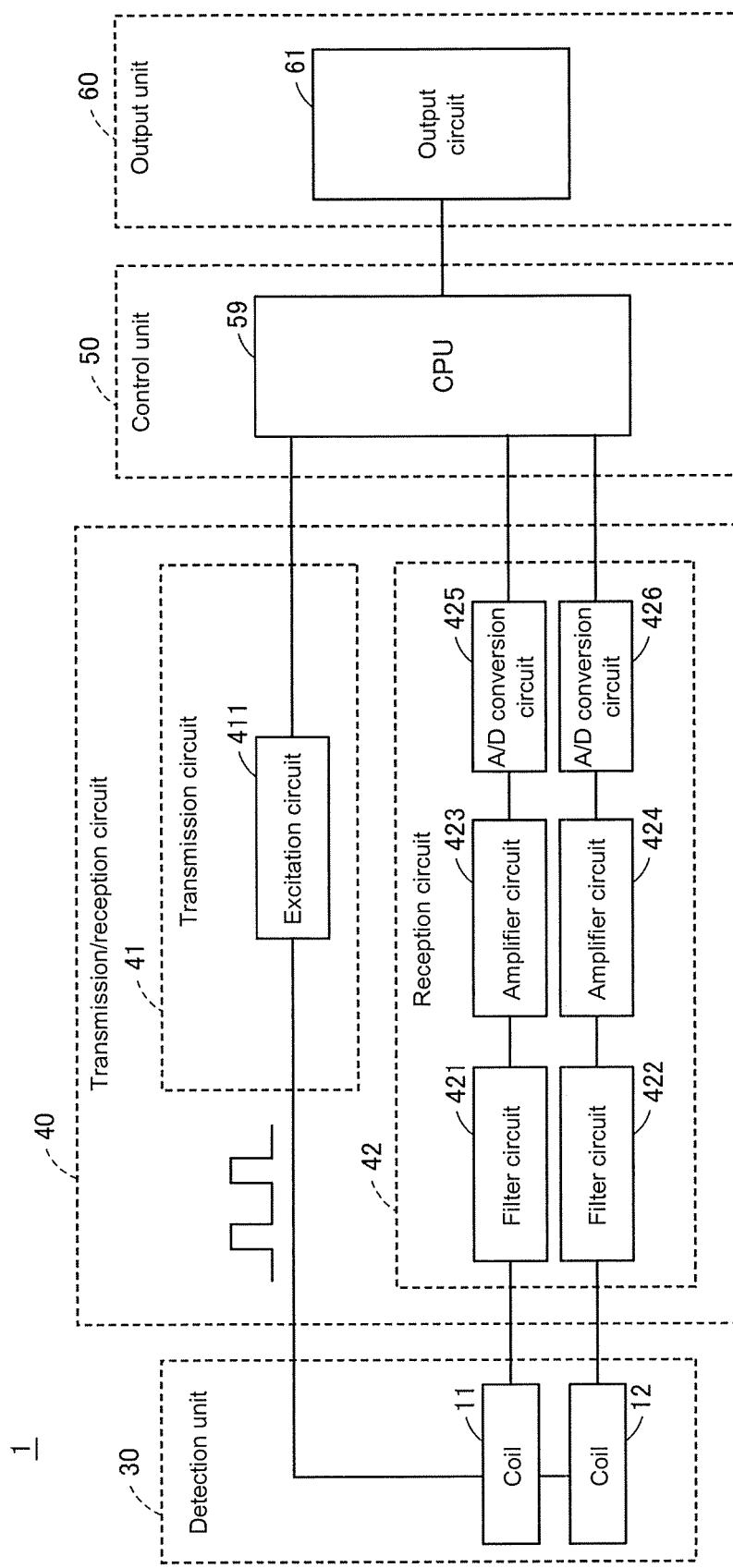
FIG. 6 is a block diagram for describing a hardware configuration of the proximity sensor.

FIG. 6 is a circuit block diagram for describing a hardware configuration of the proximity sensor 1. Referring to FIG. 6, the detection unit 30 includes the coils 11 and 12. The control unit 50 includes a processor such as a CPU (central processing unit) 59 or the like. The output unit 60 includes an output circuit 61.

The transmission/reception circuit 40 includes a transmission circuit 41 and a reception circuit 42. The transmission circuit 41 includes an excitation circuit 411. The reception circuit 42 includes filter circuits 421 and 422, amplifier circuits 423 and 424, and analog/digital (A/D) conversion circuits 425 and 426.

The excitation circuit 411 periodically generates an exciting current on the basis of a control signal from the CPU 59. The exciting current is transferred to the coils 11 and 12. Note that a period in which an exciting current is generated will be referred to as an "excitation period" below. Note that, since the coils 11 and 12 are connected in series, the coils 11 and 12 have the same excitation period.

The reception circuit 42 detects voltages generated at both ends of the coils 11 and 12 (voltage signals) for each of the coils 11 and 12. Specifically, the reception circuit 42 detects voltages generated at both ends of the coils 11 and 12 after supply of the exciting current to the coils 11 and 12 is blocked.

Note that the reception circuit 42 may detect currents flowing in the coils 11 and 12 for each of the coils 11 and 12. Note that a period in which a voltage generated at both ends of the coils 11 and 12 is detected will also be referred to as a "reception period" below. The reception period is controlled (set) such that the coils 11 and 12 have the same reception period.

An analog signal indicating a detection result of the coil 11 is input to the filter circuit 421. The filter circuit 421 performs a predetermined filtering process on the input analog signal to remove noise.

The amplifier circuit 423 amplifies the analog signal that has undergone the filtering process, and outputs the amplified analog signal to the A/D conversion circuit 425.

The A/D conversion circuit 425 converts the analog signal amplified by the amplifier circuit 423 into a digital signal. The A/D conversion circuit 425 outputs the digital signal to the CPU 59.

An analog signal indicating a detection result of the coil 12 is input to the filter circuit 422. The filter circuit 422 performs a predetermined filtering process on the input analog signal to remove noise.

The amplifier circuit 424 amplifies the analog signal that has undergone the filtering process, and outputs the amplified analog signal to the A/D conversion circuit 426.

The A/D conversion circuit 426 converts the analog signal amplified by the amplifier circuit 424 into a digital signal. The A/D conversion circuit 426 outputs the digital signal to the CPU 59.

As described above, the proximity sensor 1 senses the presence or position of a metallic detection object using a magnetic field in a state in which the proximity sensor 1 is mounted on the support member 900 using the mounting metal fitting 800. The proximity sensor 1 includes (i) the plurality of detection coils 11 and 12 for generating magnetic fields, (ii) the transmission circuit 41 for supplying a current to each of the coils 11 and 12, (iii) the reception circuit 42 for detecting voltages generated at both ends of the coils 11 and 12 or currents flowing in the coils 11 and 12 due to the supply of the current for each of the coils 11 and 12, and (iv) the control unit 50 that senses the presence or position of the detection object 700 by using the detection results.

Figure 7:
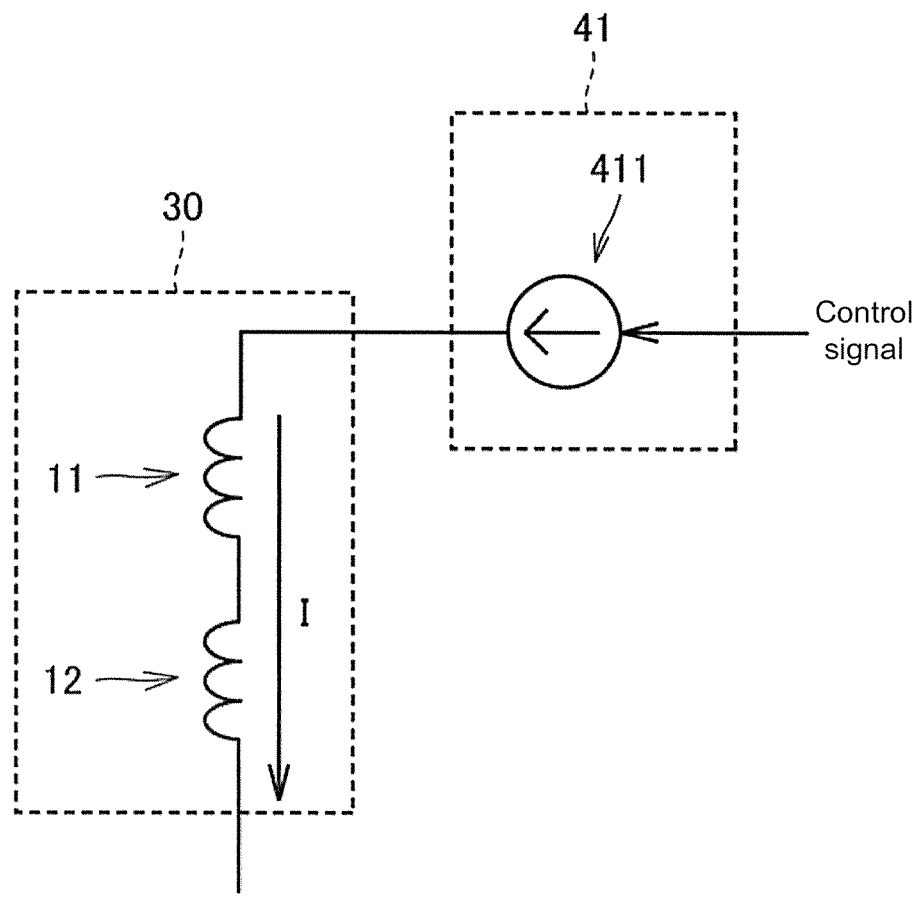
FIG. 7 is a diagram showing a specific configuration example of a detection unit and a transmission circuit.

FIG. 7 is a diagram showing a specific configuration example of the detection unit 30 and the transmission circuit 41. Referring to FIG. 7, the coil 11 and the coil 12 are connected in series. Specifically, the excitation circuit 411 is connected to one end of the coil 11, and the other end of the coil 11 is connected to one end of the coil 12.

The excitation circuit 411 generates an exciting current on the basis of a control signal from the CPU 59. The exciting current I flows in the coil 11 and the coil 12 in that order.

Figure 8:
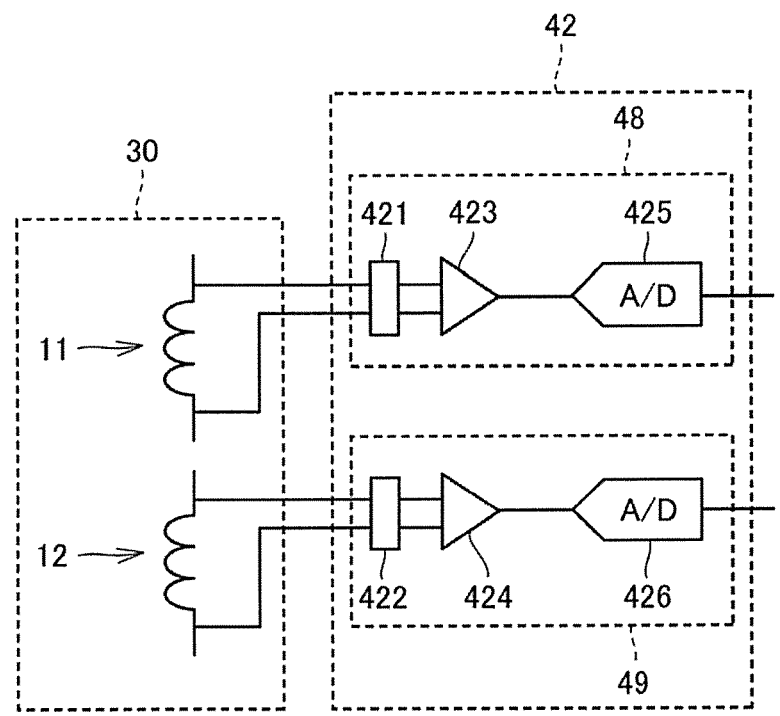
FIG. 8 is a diagram showing a specific configuration example of the detection unit and a reception circuit.

FIG. 8 is a diagram showing a specific configuration example of the detection unit 30 and the reception circuit 42. Referring to FIG. 8, both ends of the coil 11 are connected to the filter circuit 421. Both ends of the coil 12 are connected to the filter circuit 422.

In addition, the reception circuit 42 has a processing system 48 for the coil 11 and a processing system 49 for the coil 12 that are independent from each other. The processing system 48 includes the filter circuit 421, the amplifier circuit 423, and the A/D conversion circuit 425. The processing system 49 includes the filter circuit 422, the amplifier circuit 424, and the A/D conversion circuit 426.

With this configuration, the reception circuit 42 can process a voltage signal indicating an induced voltage generated at both ends of the coil 11 and a voltage signal indicating an induced voltage generated at both ends of the coil 12 independently. That is, the reception circuit 42 has a circuit configuration in which the voltage signals can be independently extracted. Accordingly, the reception circuit 42 can output both voltage signals to the CPU 59 individually.

B. Data Processing (b1. Generation of Time Series Data)

Figure 9:
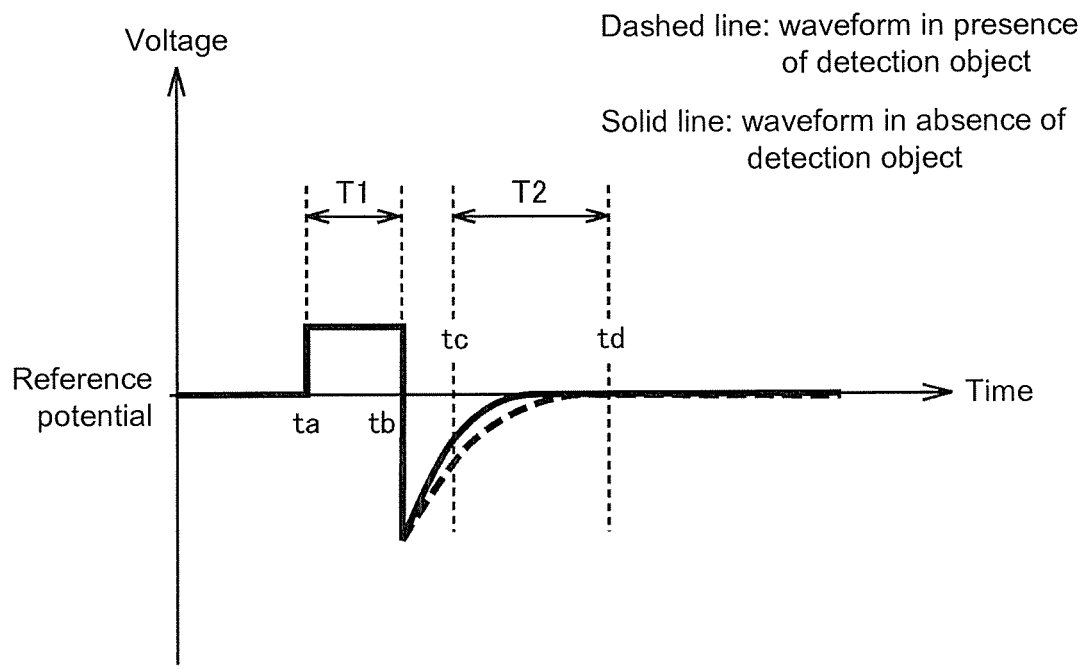
FIG. 9 is a graph showing waveforms of voltages generated at both ends of a coil.

FIG. 9 is a graph showing waveforms of voltages generated at both ends of the coil 11. Referring to FIG. 9, a period T1 (from a time ta to a time tb) is an excitation period. After the excitation period, an induced voltage (a transient signal) is generated at both ends of the coil 11. A period T2 (from a time tc to a time td) that is at least a part of the period in which an induced voltage is generated in the proximity sensor 1 is set as a reception period. The reception circuit 42 performs A/D conversion on a voltage signal within the reception period (the period T2).

In FIG. 9, voltages detected when there is no detection object 700 are indicated by a solid line, and voltages detected when there is the detection object 700 are indicated by a dashed line. As is obvious from the two lines, the voltages have lower values after the excitation period (after the time tb) when there is the detection object 700 than when there is no detection object 700.

Therefore, the control unit 50 receives digital signals having different values when there is the detection object 700 and when there is no detection object from the reception circuit 42.

Since the voltages generated at both ends of the coil 12 tend to be similar to the waveforms shown in FIG. 9, description thereof will not be repeated here.

Figures 10, 11:
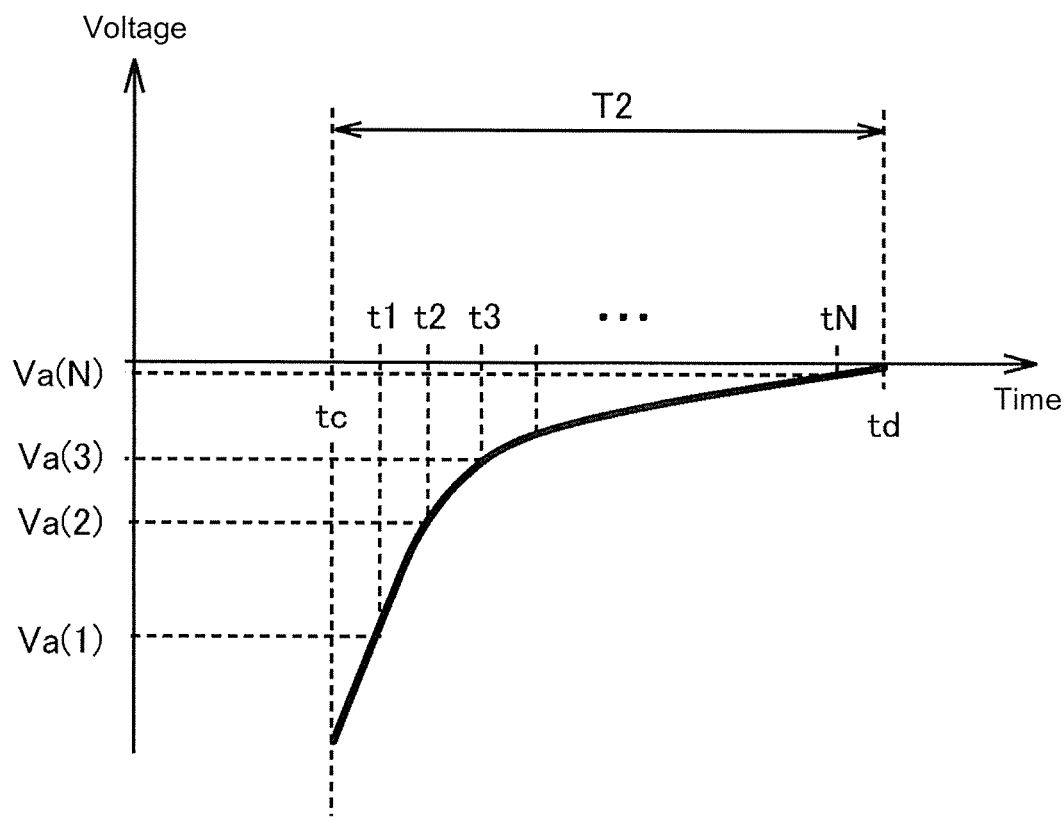
FIG. 10 is a graph for describing A/D conversion in the reception period of FIG. 9.
FIG. 11 is a table showing time series data output from an A/D conversion circuit.

FIG. 10 is a graph for describing A/D conversion in the period T2 that is the reception period of FIG. 9. Referring to FIG. 10, voltage values are detected from the time tc at predetermined time intervals, and these values are transmitted to the control unit 50 as reception data of the reception circuit 42. In the example of FIG. 10, voltage values Va(1), Va(2), Va(3), . . . , and Va(N) of times t1, t2, t3, . . . , and tN are obtained through A/D conversion. Note that a voltage value of a time tj (j is an integer from 1 to N) is denoted by Va(j) below.

In addition, likewise for the coil 12, voltage values Vb(1), Vb(2), Vb(3), . . . , and Vb(N) of times t1, t2, t3, . . . , and tN are obtained through A/D conversion. Note that a voltage value of a time tj is denoted by Vb(j) below.

FIG. 11 is a table showing time series data D11 output from the A/D conversion circuits 425 and 426 (refer to FIG. 6). Referring to FIG. 11, the reception circuit 42 generates the time series data D11 by associating a voltage value Va(j) within the reception period and a voltage value Vb(j) within the reception period and temporarily storing the values, and transmits the time series data D11 to the control unit 50 at a time at which the reception period ends.

Note that the control unit 50 may sequentially acquire the voltage values Va(j) and Vb(j) from the reception circuit 42 and generate the time series data D11.

(b2. Pre-Processing Computation)

Figure 12:
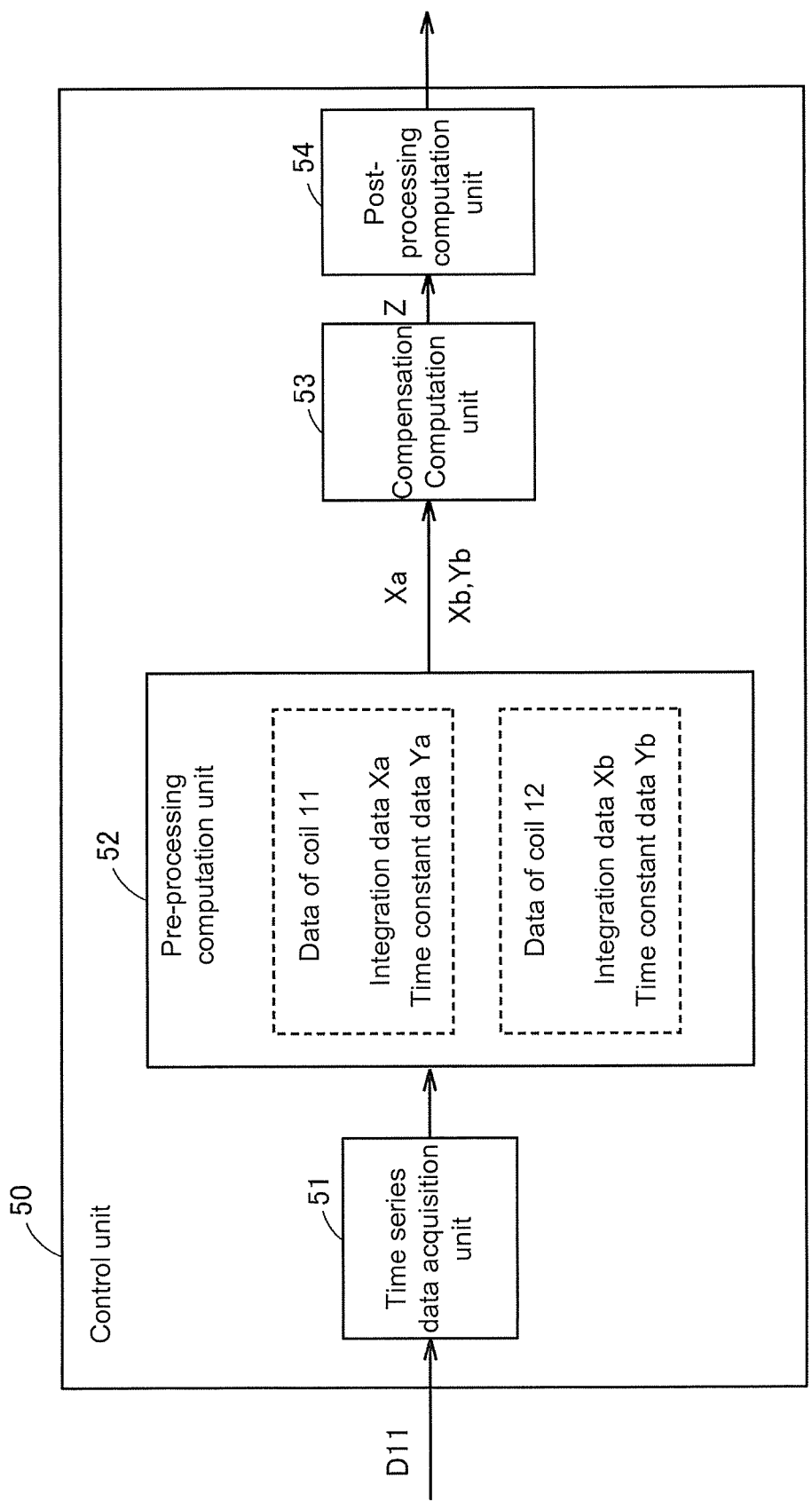
FIG. 12 is a functional block diagram for describing a functional configuration of a control unit.

FIG. 12 is a functional block diagram for describing a functional configuration of the control unit 50. Referring to FIG. 12, the control unit 50 includes a time series data acquisition unit 51, a pre-processing computation unit 52, a compensation computation unit 53, and a post-processing computation unit 54.

The time series data acquisition unit 51 acquires the time series data D11 from the reception circuit 42, and transfers the time series data D11 to the pre-processing computation unit 52. Note that the acquisition of the time series data D11 and the transfer thereof to the pre-processing computation unit 52 are performed in each reception period.

The pre-processing computation unit 52 performs pre-processing computation for compensation computation to be described below on the time series data D11 received from the reception circuit 42. Details of the pre-processing computation will be described below.

As the pre-processing computation, the pre-processing computation unit 52 extracts components that are easily affected by a distance to the detection object 700 and components that are easily affected by a material of the detection object 700 from the time series data D11 received from the reception circuit 42 for each of the coils 11 and 12.

In the pulse excitation method used by the proximity sensor 1, influence of a metal that is in proximity to the coil 11 and 12 is expressed by amplitude or a time constant of a transient change of voltage waveforms of the coils after application of a pulse. Therefore, the pre-processing computation unit 52 performs conversion from the time series data D11 to integration data and time constant data.

Note that the "integration data" is the sum of values of data chronologically obtained in the period T2 that is a reception period, and in the case of the data of the coil 11 shown in FIG. 11, the integration data is obtained by summing values of the data from Va(1) to Va(N). In addition, the "time constant data" is a value of a time constant when a value of data obtained in in the period T2 in a time series manner approximates a transient response curve of an RL circuit or a coefficient value when the value approximates a low-order curve using a simple approximation method for obtaining the value.

Specifically, the pre-processing computation unit 52 calculates integration data Xa and time constant data Ya on the basis of the time series data D11 as data of the coil 11. Furthermore, the pre-processing computation unit 52 calculates integration data Xb and time constant data Yb on the basis of the time series data D11 as data of the coil 12.

The pre-processing computation unit 52 transfers the integration data Xa and Xb and the time constant data Ya and Yb to the compensation computation unit 53. However, it is not necessary to transfer data that is not used in the compensation computation which will be described below to the compensation computation unit 53.

(b3. Compensation Computation)

The compensation computation unit 53 performs compensation computation using the integration data Xa and Xb and the time constant data Yb. The compensation computation unit 53 obtains a signal amount obtained by subtracting influence of the mounting metal fitting 800 from a signal obtained due to the proximity of the detection object 700. That is, the compensation computation unit 53 subtracts a component caused by the mounting metal fitting 800 (a first component; a signal in accordance with influence of the mounting metal fitting 800) from a signal caused by the detection object 700 (a second component; a signal in accordance with the detection object 700). In the present embodiment, the integration data Xa corresponds to the component caused by the detection object 700, and the integration data Xb and the time constant data Yb correspond to the component caused by the mounting metal fitting 800. The reason for performing the compensation computation and details of the compensation computation will be described below.

Each piece of the integration data Xa and Xb and the time constant data Ya and Yb of the coils 11 and 12 obtained from the pre-processing computation is a physical amount indicating a transient state of a eddy current that varies depending on a material of the detection object 700, a transient state of a eddy current that varies depending on a material of the mounting metal fitting 800, a positional relationship between the detection object 700 and each of the coils 11 and 12, and a positional relationship between the mounting metal fitting 800 and each of the coils 11 and 12 overall.

The integration data Xa of the coil 11 indicates a total amount of an eddy current flowing in the detection object 700 from an open magnetism direction of a magnetic field of the coil 11, i.e., a property of a high correlation of a distance from the detection object 700 to the coil 11. However, the integration data Xa also has a correlation of a position, conductivity, and magnetic permeability of the mounting metal fitting 800 at the same time. Thus, in a situation in which presence and/or a position of the mounting metal fitting 800 are unclear, it is not possible to specify a position of the detection object 700 only using the integration data Xa.

The integration data Xb of the coil 12 indicates a total amount of an eddy current flowing in the mounting metal fitting 800 from an open magnetism direction of a magnetic field of the coil 12, i.e., a property of a high correlation of a position, conductivity, and magnetic permeability of the mounting metal fitting 800.

The time constant data Yb of the coil 12 indicates a time constant of an eddy current flowing in the mounting metal fitting 800, i.e., a property of a high correlation between conductivity and magnetic permeability of the mounting metal fitting 800.

In consideration of the above-described matters, the compensation computation unit 53 first adjusts a value of the integration data Xb of the coil 12 in accordance with an influence degree of conductivity and magnetic permeability calculated from the time constant data Yb of the coil 12. Furthermore, the compensation computation unit 53 subtracts the adjusted value from the integration data Xa of the coil 11. Accordingly, the compensation computation unit 53 can subtract the influence amount of the mounting metal fitting 800 from the integration data Xa.

A computation formula used by the compensation computation unit 53 in the compensation computation expresses magnetic coupling of each of the coils 11 and 12, the detection object 700, and the mounting metal fitting 800, and parameters thereof are the number of winding times of each of the coils 11 and 12, the distance between each of the coils 11 and 12 and the detection object 700, the distance between each of the coils 11 and 12 and the mounting metal fitting 800, and the like. Among these, parameters that change after the proximity sensor 1 is designed are positions and materials of the detection object 700, the mounting metal fitting 800, and the like, and thus by causing a reception signal obtained under a typical condition in an experiment or an electromagnetic analysis to approximate to a continuous function, a necessary computation formula can be obtained. An example of the computation formula will be described below.

Figure 13:
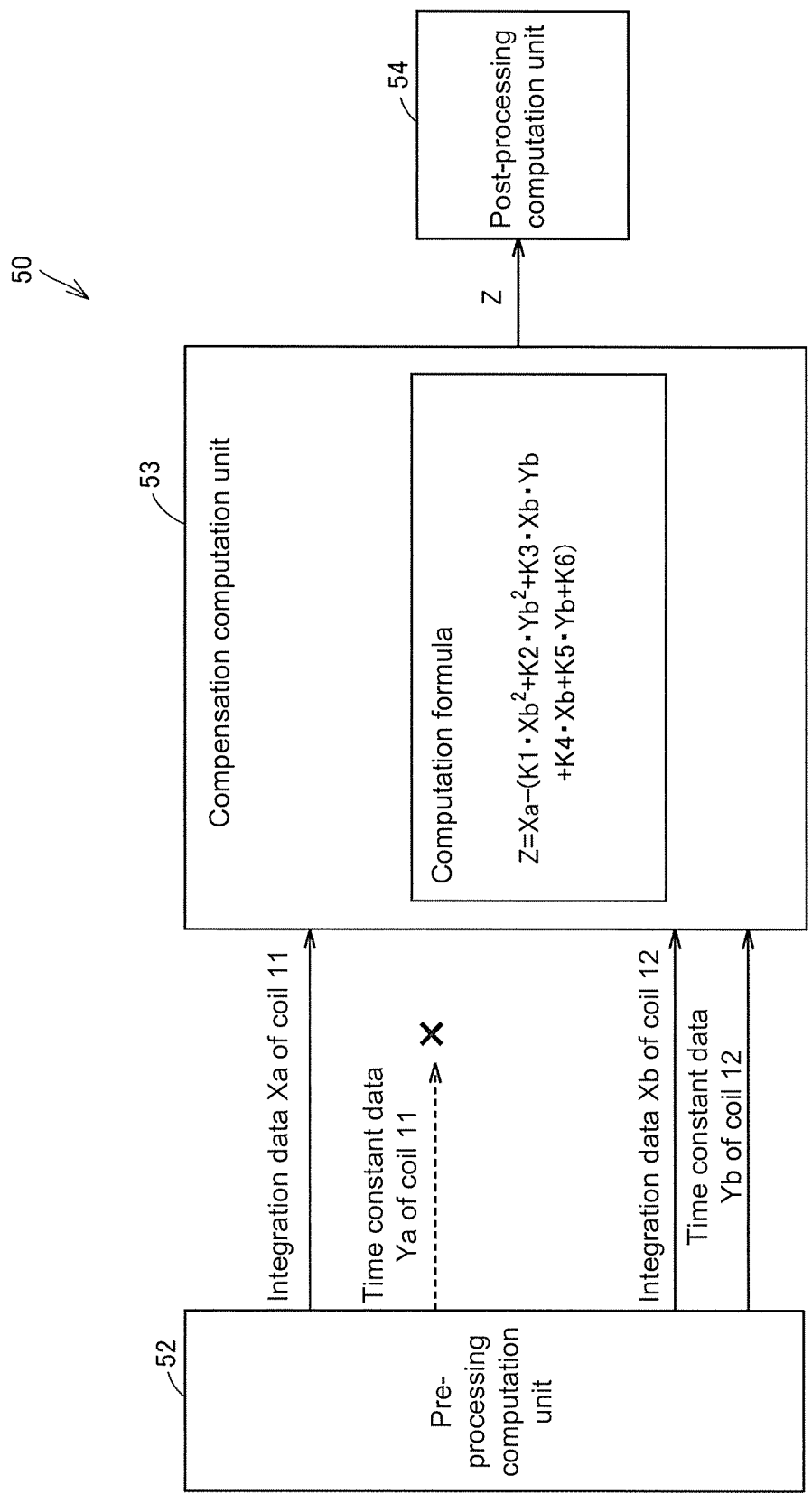
FIG. 13 is a diagram for describing a specific example of a process executed by a compensation computation unit.

FIG. 13 is a diagram for describing a specific example of a process executed by the compensation computation unit 53. Referring to FIG. 13, the compensation computation unit 53 assigns the integration data Xa and Xb and the time constant data Yb acquired from the pre-processing computation unit 52 into the following computation formula (1) as an example and thereby obtains a signal amount Z from which influence of the mounting metal fitting 800 is subtracted. Furthermore, the compensation computation unit 53 transfers the signal amount Z to the post-processing computation unit 54.

$$Z=Xa-(K1 \times Xb^2+K2 \times Yb^2+K3 \times Xb \times Yb+K4 \times Xb+K5 \times Yb+K6) \quad (1)$$

The above-described computation formula (1) is a formula used when an approximate curve is generated using a curve of a quadratic function on the basis of the decision method that will be described in FIG. 14. A function shape of the approximate curve does not have to be the above-described shape, and a higher-order shape, an exponent shape, or the like may be used if necessary.

Figure 14:
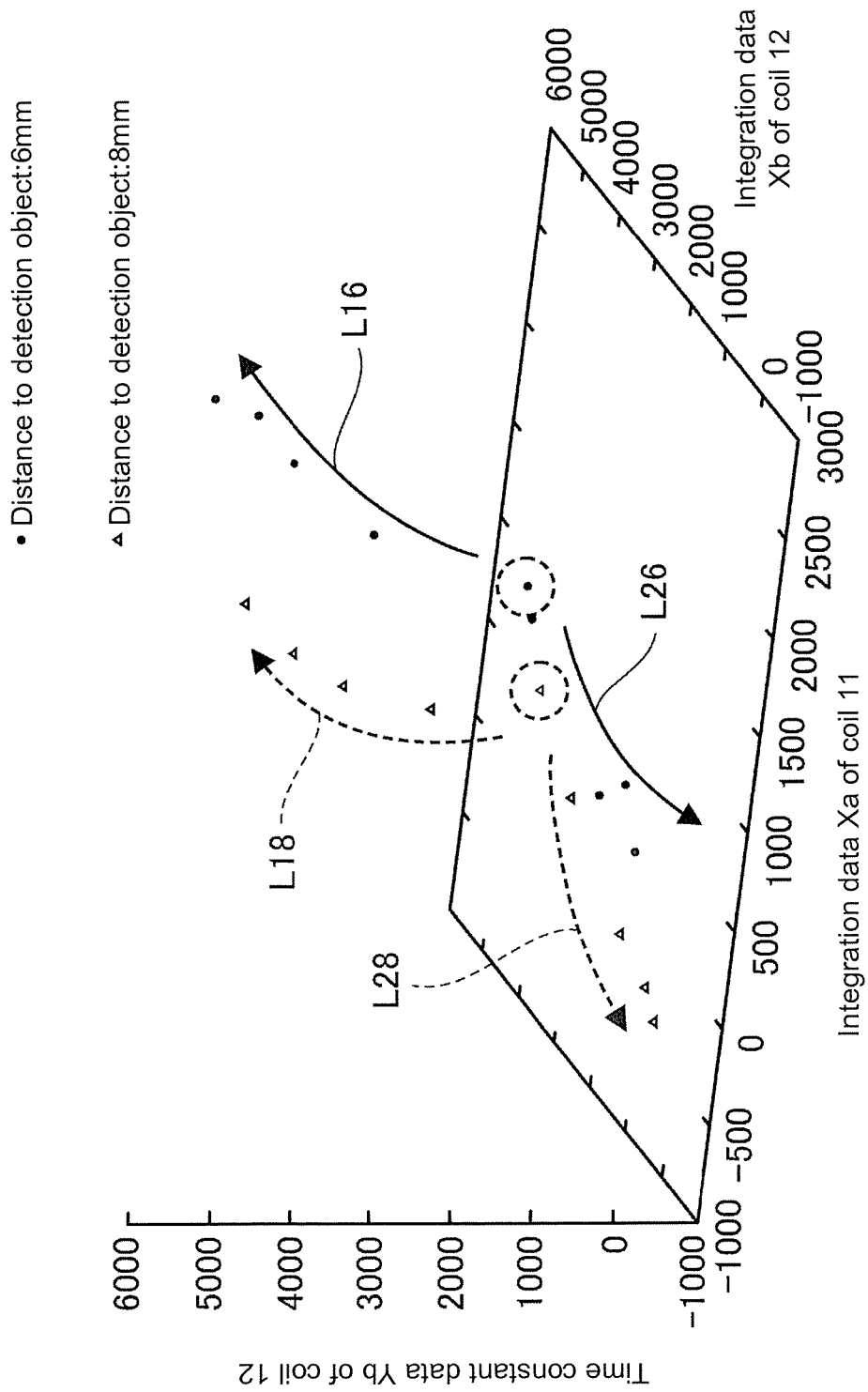
FIG. 14 is a diagram for describing an example of a design method of a computation formula to be used in compensation computation.

FIG. 14 is a diagram for describing an example of a design method of a computation formula to be used in the compensation computation. Referring to FIG. 14, the 3D plot is obtained by changing values of the data Xa, Xb, and Yb after the pre-processing computation described in FIG. 13 as condition parameters of an approach distance of the detection object 700 to the proximity sensor 1, and a position and a material of the mounting metal fitting 800.

Two data marks surrounded by dashed-lined circles are data obtained under a condition of a different distance to the detection object 700 with no presence of the mounting metal fitting 800. The circular marks indicate data obtained when a distance to the detection object 700 is 6 mm, and the triangular marks indicate data obtained when a distance to the detection object 700 is 8 mm.

When an installation position of an iron mounting metal fitting 800 with respect to the body part 5 is changed, the positions of the marks are changed with directionality in the 3-dimensional data space. In addition, when an installation position of an aluminum mounting metal fitting 800 with respect to the body part 5 is changed, the positions of the marks are changed with directionality in the 3-dimensional data space.

The arrow L16 indicates a direction of a data plot change when a distance to the detection object 700 is 6 mm and an installation position of the iron mounting metal fitting 800 is changed. The arrow L26 indicates a direction of a data plot change when a distance to the detection object 700 is 6 mm and an installation position of the aluminum mounting metal fitting 800 is changed.

The arrow L18 indicates a direction of a data plot change when a distance to the detection object 700 is 8 mm and an installation position of the iron mounting metal fitting 800 is changed. The arrow L28 indicates a direction of a data plot change when a distance to the detection object 700 is 8 mm and an installation position of the aluminum mounting metal fitting 800 is changed.

The directions of the changes indicate that the integration data Xb and the time constant data Yb of the coil 12 reflect the positions and the materials of the mounting metal fitting 800 as described on the basis of FIG. 13. By separating the data groups each having different distances to the detection object 700 using the curves of the directions of the changes, the proximity sensor 1 can determine a distance to the detection object 700.

That is, in order to determine an approach distance of the detection object 700 regardless of a position of the mounting metal fitting 800, a ratio of the integration data Xb and the time constant data Yb of the coil 12 to be combined with the integration data Xa of the coil 11 may be obtained on the basis of data acquired by changing the distance to the detection object 700 as a formula of an approximate curve connecting data points on a 3-dimensional space.

Data to be used may not necessarily be the integration data Xa of the coil 11 and the integration data Xb and the time constant data Yb of the coil 12 to obtain the same effect, and signals obtained from a plurality of coils indicating influence of the detection object 700 and the mounting metal fitting 800 at different ratios may be used.

As an example, when the form of a compensation computation formula is set to be the computation formula (1), a regression curve is obtained using a data group obtained with a certain detection distance in, for example, a weighted least square method, and then the coefficients K1 to K6 of the computation formula (1) are decided.

(b4. Post-Processing Computation)

Referring to FIG. 12 again, to determine whether there is the detection object 700, the post-processing computation unit 54 executes a binary determination process using the signal amount Z acquired from the compensation computation unit 53. The post-processing computation unit 54 outputs a signal indicating presence of the detection object 700 to the output unit 60.

In addition, the post-processing computation unit 54 converts the signal amount Z into a distance to calculate a distance to the detection object 700. The post-processing computation unit 54 outputs a signal indicating the distance to the detection object 700 to the output unit 60.

(b5. Advantages)

The proximity sensor 1 reacts only to a metal (the detection object 700) approaching in a direction desired to be detected while reducing influence of a metal (the mounting metal fitting 800) mounted in a direction desired not to be detected. That is, even when detection sensitivity of the proximity sensor 1 is set to be high, the proximity sensor 1 can perform detection without being affected by the mounting metal fitting 800. Therefore, a detection distance of the proximity sensor 1 can increase.

In addition, since a distance between the proximity sensor 1 and a detection target (the detection object 700) can be set to be longer than in the related art, degrees of freedom in designing devices and safety of the proximity sensor 1 when the proximity sensor collides with an object (the detection object 700) can be improved.

(b6. Averaging)

There are cases in which it is necessary to perform an averaging process on a reception signal in accordance with a signal-to-noise (S/N) ratio desired to be obtained by the proximity sensor 1. In that case, the averaging process may be performed in any step among the step of data reception by the reception circuit 42, in the pre-processing computation step, and the compensation computation step using data obtained by performing excitation and signal reception a plurality of times.

C. Control Configuration

Figure 15:
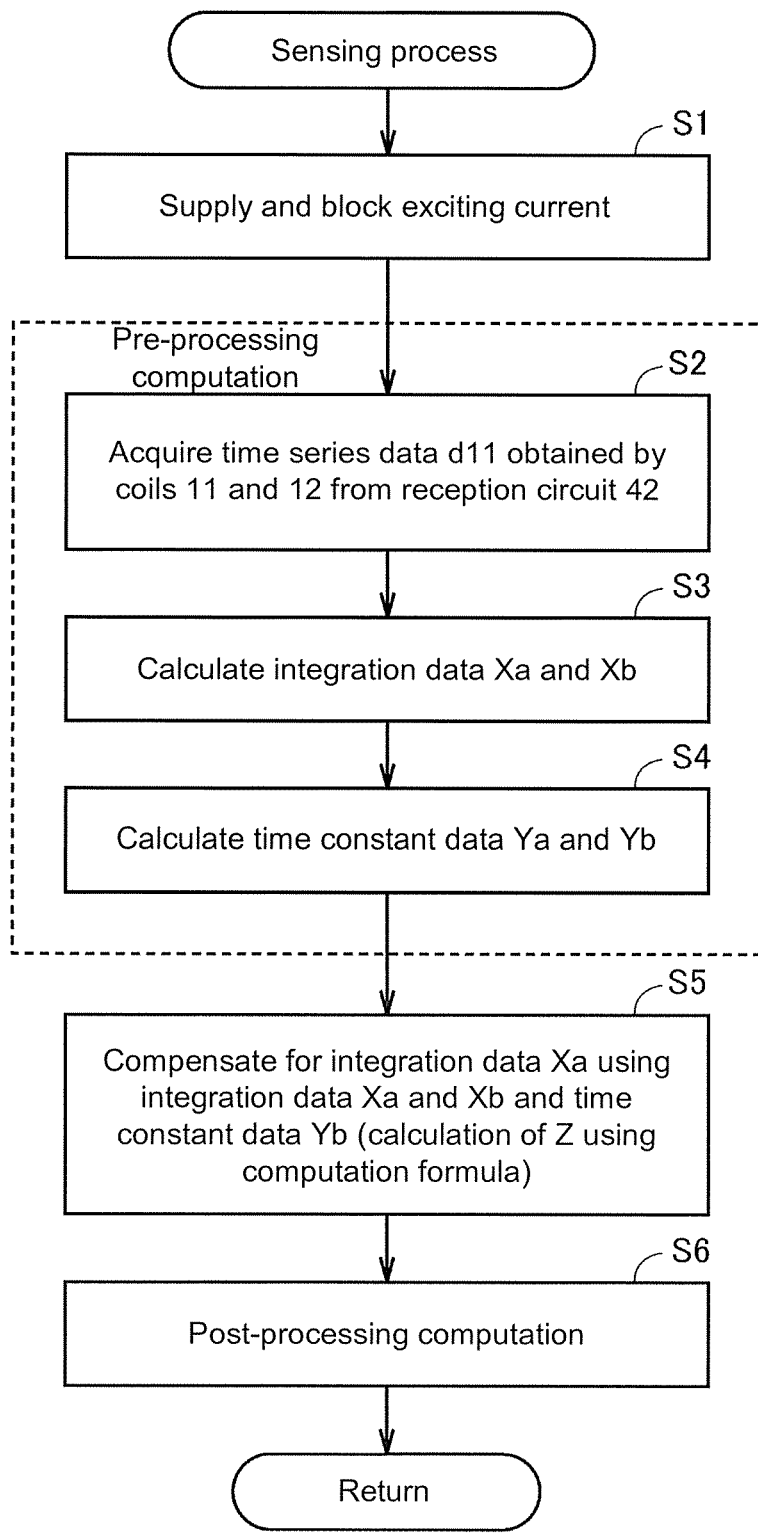
FIG. 15 is a flowchart showing a flow of some processes executed by the proximity sensor.

FIG. 15 is a flowchart showing a flow of some processes executed by the proximity sensor 1. Referring to FIG. 15, in Step S1, the excitation circuit 411 supplies an exciting current to each of the coils 11 and 12 for a certain period of time on the basis of a control command from the control unit 50, and then the supply of the exciting current is blocked. In Step S2, the control unit 50 acquires the time series data D11 obtained using the coils 11 and 12 from the reception circuit 42.

In Step S3, the control unit 50 calculates the integration data Xa and Xb on the basis of the time series data D11. In Step S4, the control unit 50 calculates the time constant data Ya and Yb on the basis of the time series data D11. Note that order of generating the integration data Xa, the integration data Xb, the time constant data Ya, and the time constant data Yb is not limited to that shown in Step S3 and Step S4.

In Step S5, the control unit 50 compensates the integration data Xa by using the integration data Xa, the integration data Xb, and the time constant data Yb. The control unit 50 calculates the signal amount Z using, for example, the above-described computation formula (1). In Step S6, the control unit 50 performs the above-described post-processing computation.

D. Conclusion (1) The proximity sensor 1 senses the presence or position of a metallic detection object using a magnetic field in a state in which the proximity sensor is mounted on the support member 900 using the mounting metal fitting 800. The proximity sensor 1 includes the plurality of coils 11 and 12 for generating magnetic fields, the transmission circuit 41 that supplies a current to each of the coils 11 and 12, the reception circuit 42 that detects voltages generated at both ends of the coils 11 and 12 of currents flowing in the detection coils due to the supply of the current for each of the coils 11 and 12 and, the control unit 50 that senses the presence or position of the detection object 700 using a detection result of the reception circuit 42, and the output unit 60 that outputs a sensing result of the control unit.

The control unit 50 extracts the first component (specifically, the integration data Xb and the time constant data Yb) caused by the mounting metal fitting 800 and the second component (specifically, the integration data Xa) caused by the detection object 700 from the detection result of the reception circuit 42 (a detection result of each of the coils 11 and 12). The control unit 50 compensates the second component using the first component. The control unit 50 senses the presence or position of the detection object 700 on the basis of the compensated second component.

According to the above-described configuration, influence of the mounting metal fitting 800 can be reduced. Accordingly, a detection distance of the proximity sensor 1 can increase.

(2) The control unit 50 compensates the second component by subtracting the first component from the second component.

(3) The reception circuit 42 detects voltages or currents for each of the coils 11 and 12 individually. In particular, the reception circuit 42 has the plurality of processing systems 48 and 49 each corresponding to the coils 11 and 12 as shown in FIG. 8. The processing systems 48 and 49 acquire voltages or currents of the coils corresponding to the processing systems.

While a compensation computation means is limited when voltages or currents are not individually (independently) acquired but electrical synthesis is used, digital signal processing can be complicated when voltages or currents are individually acquired. Therefore, accuracy of compensation can be more improved than when voltages or currents are not individually acquired.

(4) The transmission circuit 41 includes the excitation circuit 411 for periodically supplying a pulsed exciting current to each of the coils 11 and 12. The second component is the integration value of the transient currents generated at both ends of the coil 11 (the integration data Xa). The first component is a value based on the integration value of transient currents generated at both ends of the coil 12 (the integration data Xb) and time constant information of the transient currents generated at both ends of the coil 12 (the time constant data Yb).

The influence of the material of the mounting metal fitting 800 can be acquired by using the time constant information of the transient currents generated at both ends of the coil 12 (the time constant data Yb). Therefore, accuracy in compensation can be improved.

Figure 16:
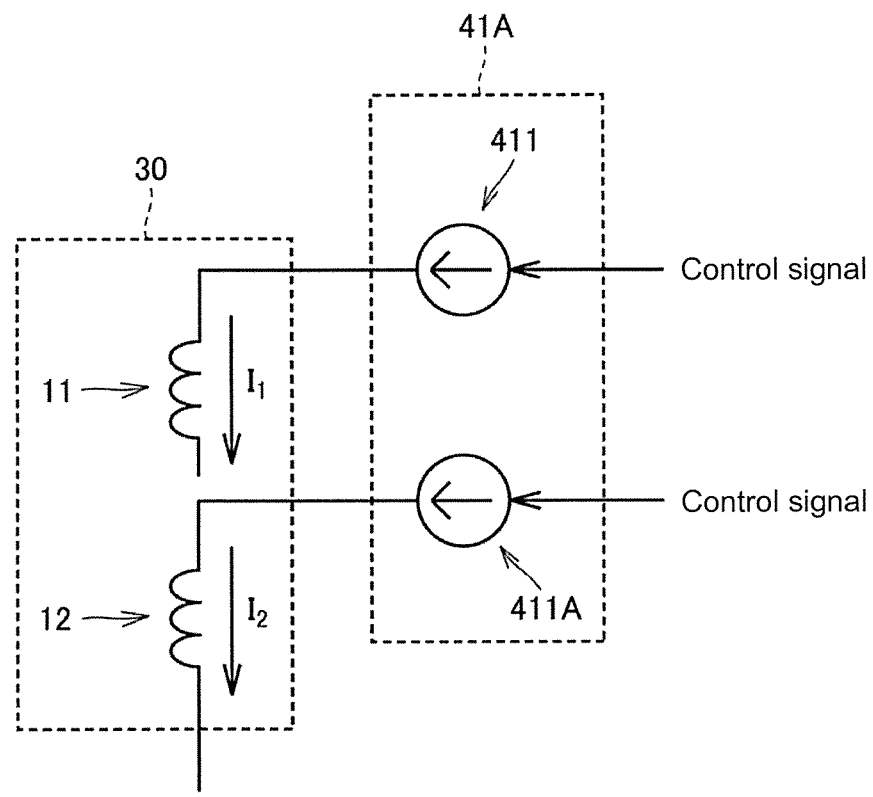
FIG. 16 is a diagram showing another specific configuration example of the detection unit and a transmission circuit.

E. Modified Example (1) FIG. 16 is a diagram showing another specific configuration example of the detection unit 30 and a transmission circuit 41A. Referring to FIG. 16, the transmission circuit 41A includes the excitation circuits 411 and 411A. The excitation circuit 411 is connected to the coil 11 but is not connected to the coil 12. The excitation circuit 411A is connected to the coil 12.

The excitation circuit 411 generates an exciting current on the basis of a control signal from the CPU 59. This exciting current $I_1$ flows in the coil 11. The excitation circuit 411A generates an exciting current on the basis of a control signal from the CPU 59. This exciting current $I_2$ flows in the coil 12.

The same effect as in the case of FIG. 7 is obtained in the configuration of the transmission circuit 41A (excitation circuit) that causes exciting currents to independently flow in the coils 11 and 12 as described above.

In addition, the proximity sensor 1 may be configured to have a common excitation circuit for the coil 11 and the coil 12 to cause exciting currents to independently flow in the coils 11 and 12 through a shift process.

Figure 17:
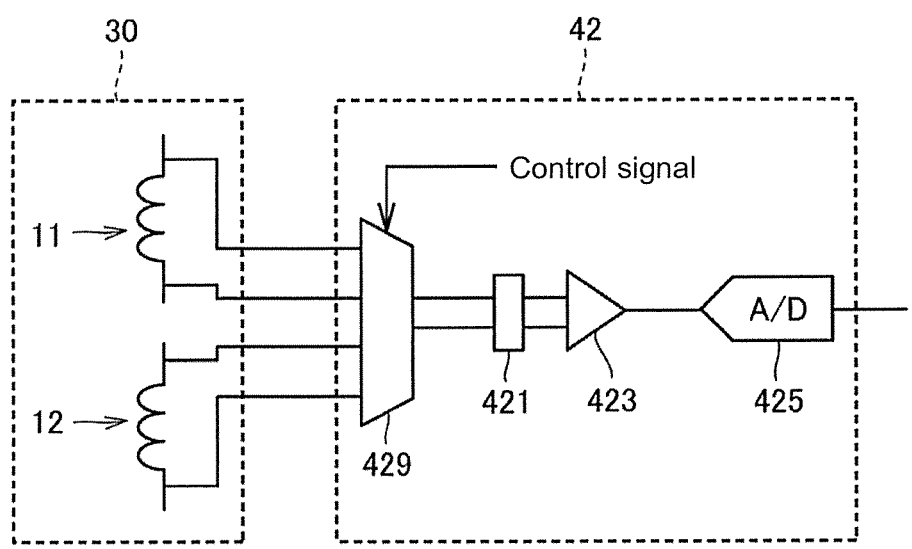
FIG. 17 is a diagram showing another specific configuration example of the detection unit and a reception circuit.

(2) FIG. 17 is a diagram showing another specific configuration example of the detection unit 30 and a reception circuit 42. Referring to FIG. 17, the reception circuit 42 includes a multiplexer circuit 429, a filter circuit 421, an amplifier circuit 423, and an A/D conversion circuit 425. The reception circuit 42 of this case has a different configuration from that shown in FIG. 8, and needs not to have the filter circuit 422, the amplifier circuit 424, and the A/D conversion circuit 426.

Both ends of the coil 11 and both ends of the coil 12 are connected to multiplexer circuit 429. The multiplexer circuit 429 receives input of a control signal from the CPU 59. When the multiplexer circuit 429 performs an input signal selection process on the basis of the control signal, the reception circuit 42 can independently process a voltage signal indicating induced voltages generated at both ends of the coils 11 and 12 as a common reception circuit (including the filter circuit 421, the amplifier circuit 423, and the A/D conversion circuit 425) to the coil 11 and the coil 12. That is, the reception circuit 42 detects voltages or currents from the coils 11 and 12 at different timings in a time dividing manner.

Accordingly, the reception circuit 42 can output individual voltage signals of both coils to the CPU 59. Note that the reception circuit 42 may be configured to have a filter circuit and an amplifier circuit for each of the coils 11 and 12 and have a common A/D conversion circuit.

Figure 18:
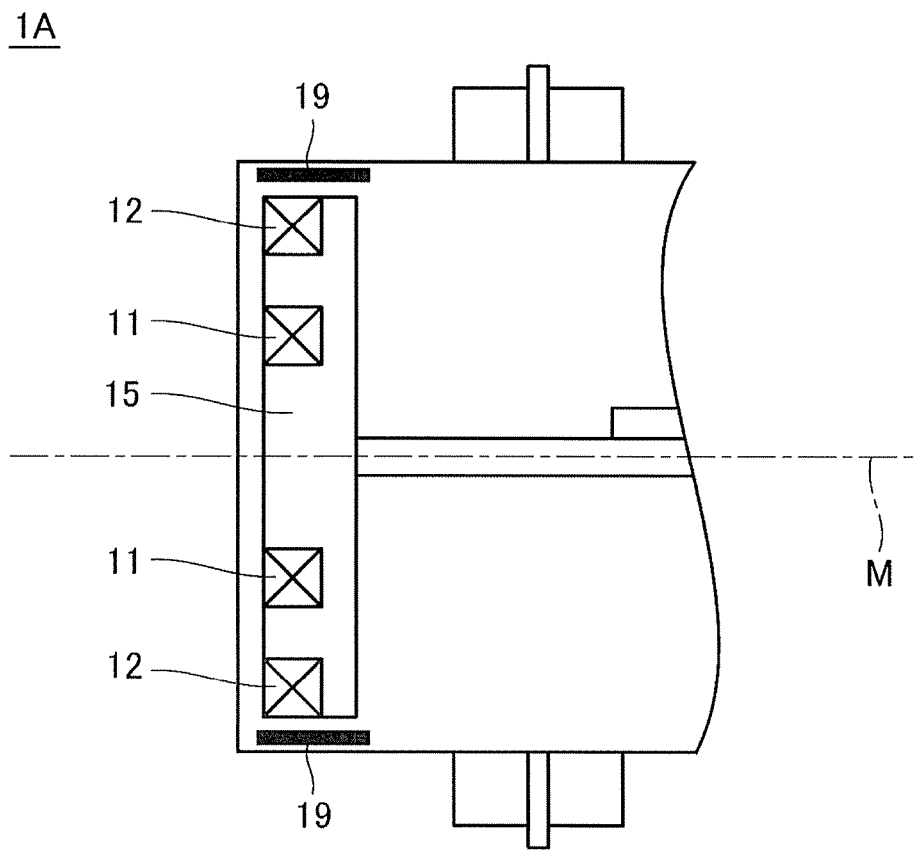
FIG. 18 is a cross-sectional diagram of a proximity sensor according to another embodiment.

(3) FIG. 18 is a cross-sectional diagram of a proximity sensor 1A. Referring to FIG. 18, the proximity sensor 1A has a sheet-like magnetic material 19 disposed along an outer circumference of the coil 12.

As described above, a configuration in which the open magnetic path of the coil 12 is limited to being in an approach direction to the detection object 700 is preferable. In addition, it is preferable to dispose the sheet-like magnetic material to surround the outside of the coil 12 in order to secure a disposition margin in the radial direction or a size of the outer diameter of the coil. Particularly for the material 19, a magnetic thin plate or a magnetic sheet using permalloy or an amorphous alloy whose thickness is reduced to secure high magnetic permeability is preferable.

With the above-described configuration, an appearance of influence of the mounting metal fitting 800 can be limited and accuracy in compensation can be improved. Note that, since a process of the control unit 50 is the same as that of the proximity sensor 1, description thereof will not be repeated here.

Figure 19:
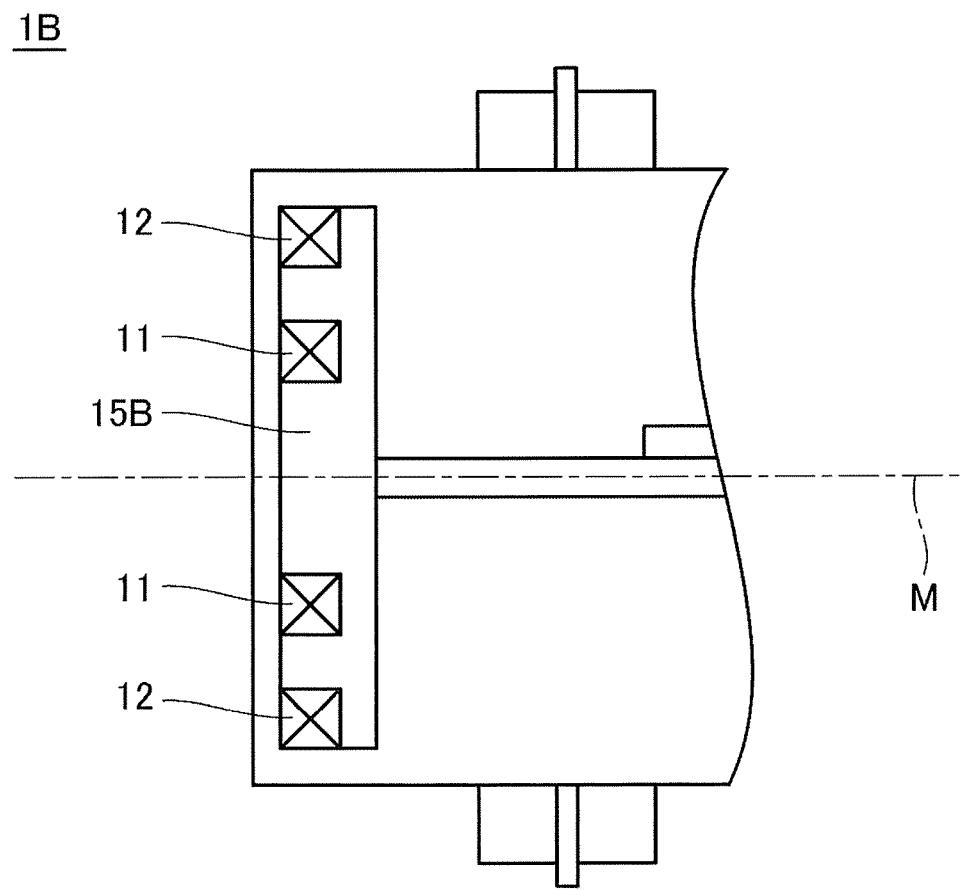
FIG. 19 is a cross-sectional diagram of a proximity sensor according to still another embodiment.

(4) FIG. 19 is a cross-sectional diagram of a proximity sensor 1B. Referring to FIG. 19, the proximity sensor 1B has a ferrite core 15B, instead of the ferrite core 15. The ferrite core 15B does not cover an outer circumferential portion of the coil 12, unlike the ferrite core 15. This configuration also can reduce influence of the mounting metal fitting 800.

Figure 20:
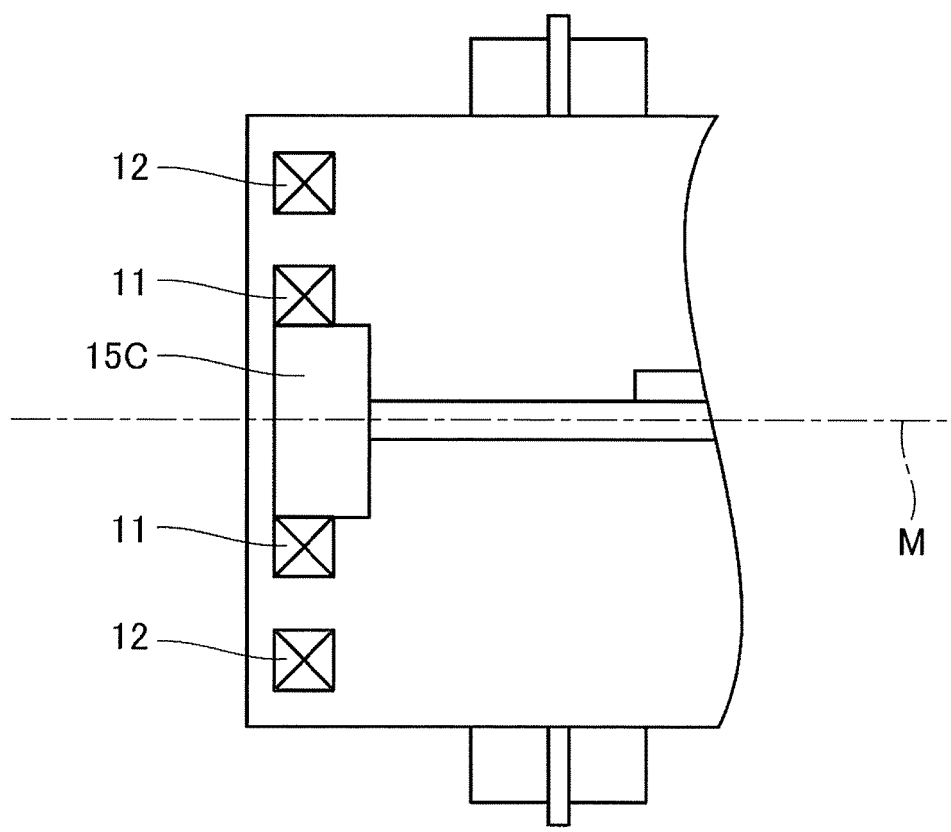
FIG. 20 is a cross-sectional diagram of a proximity sensor according to still another embodiment.

(5) FIG. 20 is a cross-sectional diagram of a proximity sensor 1C. Referring to FIG. 20, the proximity sensor 1C has a ferrite core 15C, instead of the ferrite core 15.

The ferrite core 15C is positioned on an inner circumference side of the coil 11. The ferrite core 15C does not cover an outer circumference part of the coil 11, unlike the ferrite core 15. In addition, the ferrite core 15C does not cover an inner circumference part and an outer circumference part of the coil 12.

The above-described configuration also can reduce influence of the mounting metal fitting 800.

Figure 21:
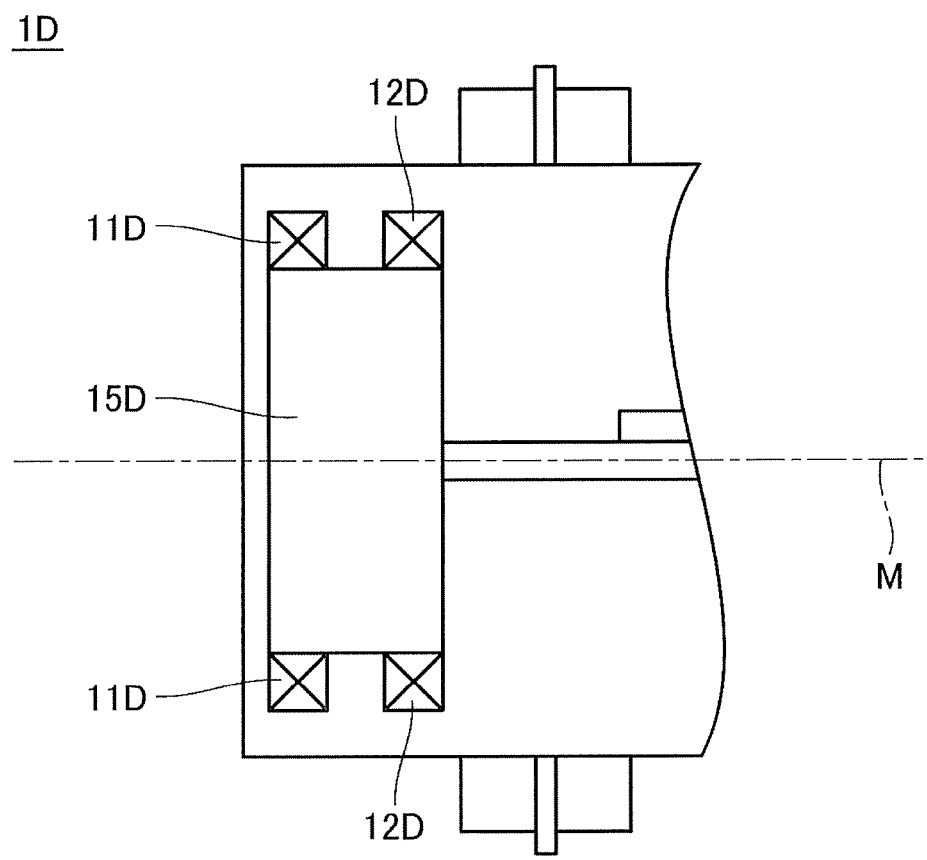
FIG. 21 is a cross-sectional diagram of a proximity sensor according to still another embodiment.

(6) FIG. 21 is a cross-sectional diagram of a proximity sensor 1D. Referring to FIG. 21, the proximity sensor 1D has a coil 11D and a coil 12D with the same diameter, instead of the coils 11 and 12. The proximity sensor 1D has a ferrite core 15D, instead of the ferrite core 15.

The coil 11D and the coil 12D are disposed at positions deviating from a center axis M. The ferrite core 15D is disposed on an inner circumference side of the coil 11D and an inner circumference side of the coil 12D. The ferrite core 15D does not cover an outer circumference part of the coil 11D and an outer circumference part of the coil 12D.

The above-described configuration also can reduce influence of the mounting metal fitting 800. Note that the coil 11D and the coil 12D may have different diameters. The same applies to the proximity sensors 1E and 1F which will be described below.

Figure 22:
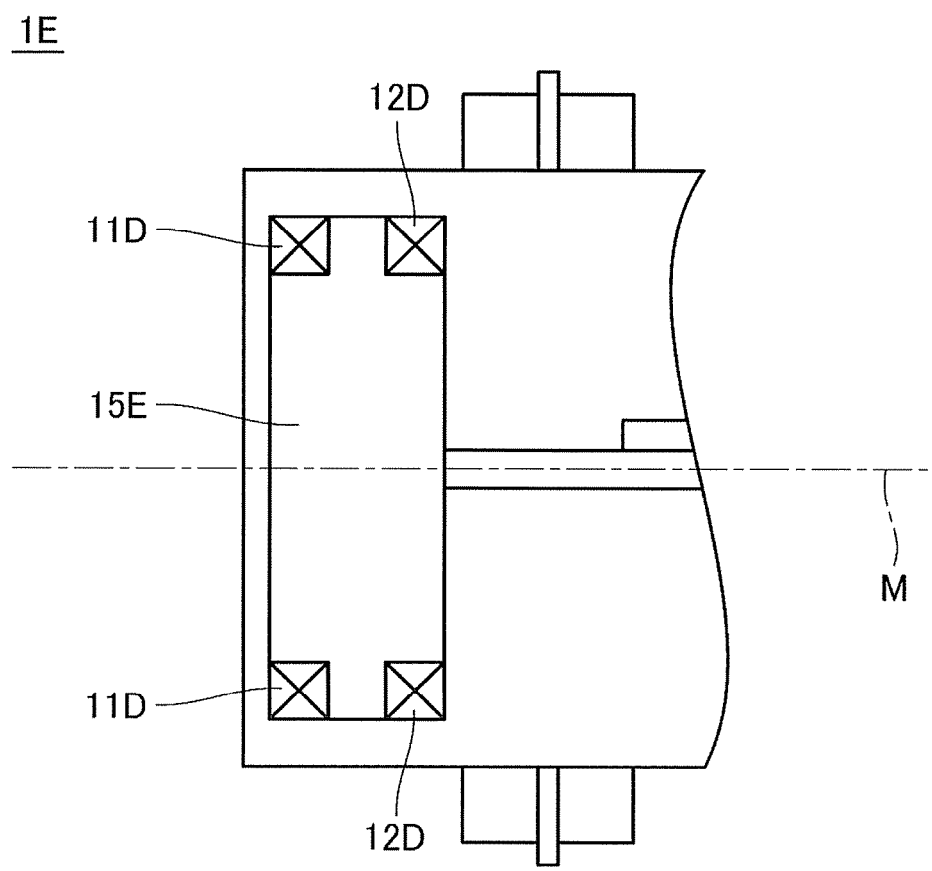
FIG. 22 is a cross-sectional diagram of a proximity sensor according to still another embodiment.

(7) FIG. 22 is a cross-sectional diagram of the proximity sensor 1E. Referring to FIG. 22, the proximity sensor 1E has a ferrite core 15E. The proximity sensor 1E has the ferrite core having a different shape from that of the proximity sensor 1D (of FIG. 21). A part of the ferrite core 15E is formed between the coil 11D and the coil 12D.

The above-described configuration also can reduce influence of the mounting metal fitting 800.

Figure 23:
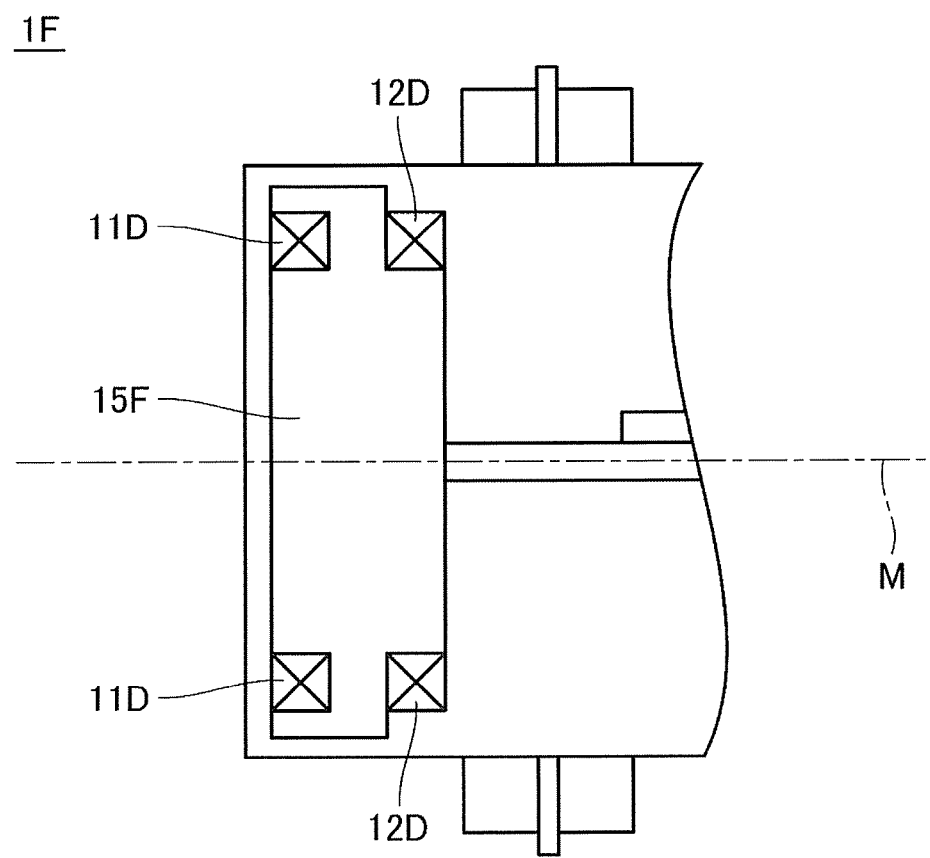
FIG. 23 is a cross-sectional diagram of a proximity sensor according to still another embodiment.

(8) FIG. 23 is a cross-sectional diagram of the proximity sensor 1F. Referring to FIG. 23, the proximity sensor 1F has a ferrite core 15F. The proximity sensor 1F has the ferrite core having a different shape from that of the proximity sensor 1E (of FIG. 22). The ferrite core 15F covers an outer circumference part of a coil 11D, unlike the ferrite core 15E. This configuration also can reduce influence of the mounting metal fitting 800.

(9) Although the configurations in which two coils 11 and 12 are provided have been exemplified above, the number of coils is not limited two. For example, three or more coils may be provided.

Second Embodiment

In the present embodiment, an oscillation proximity sensor among proximity sensors (inductive proximity sensors) that sense the presence or positions of metallic detection objects using magnetic fields will be described.

Figure 24:
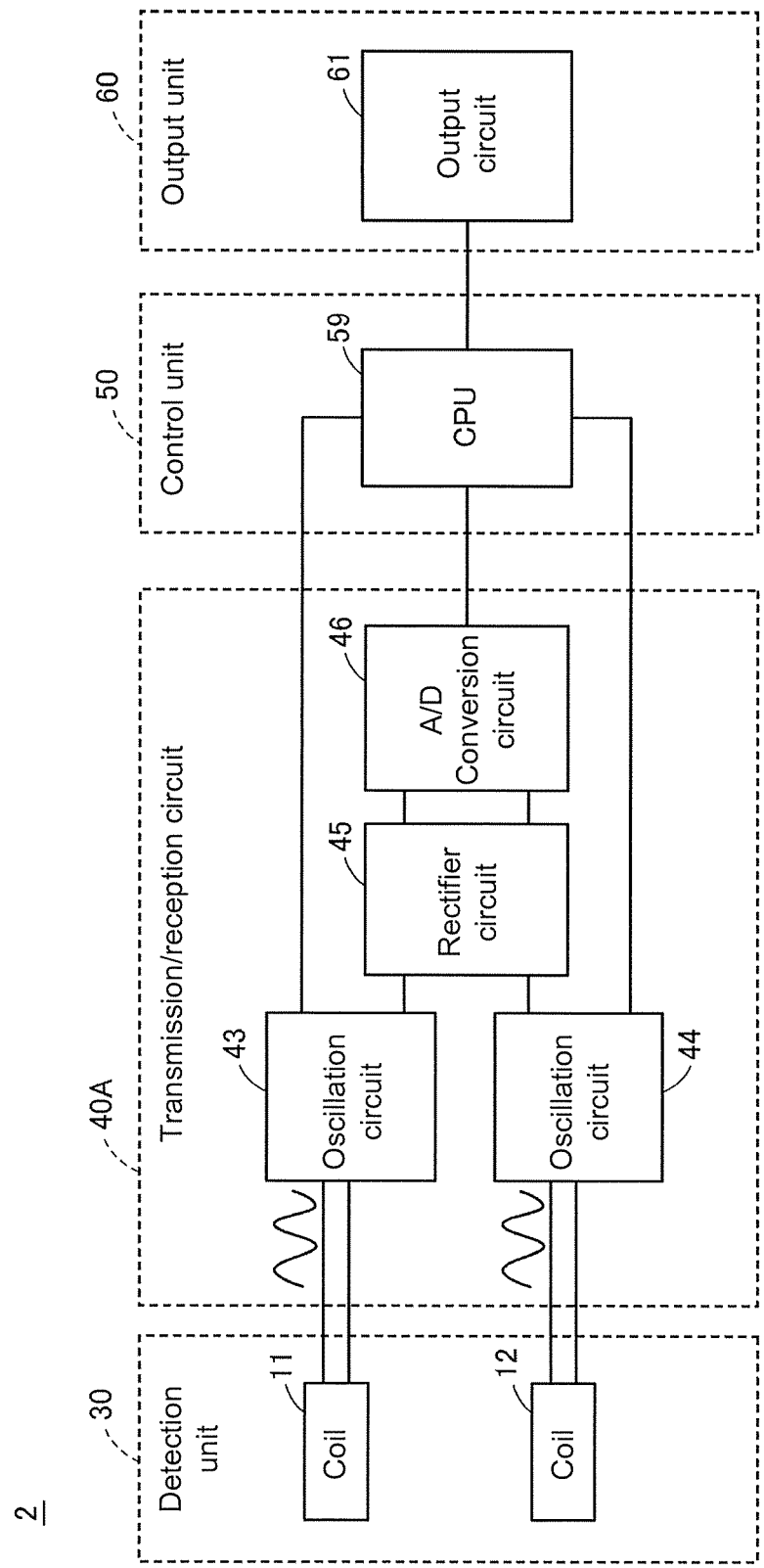
FIG. 24 is a block diagram for describing a hardware configuration of a proximity sensor according to still another embodiment.

FIG. 24 is a block diagram for describing a hardware configuration of a proximity sensor 2 according to the present embodiment. Referring to FIG. 24, the proximity sensor 2 includes a detection unit 30, a transmission/reception circuit 40A, a control unit 50, and an output unit 60.

The detection unit 30 includes coils 11 and 12. The control unit 50 includes a processor such as a CPU 59. The output unit 60 includes an output circuit 61.

The transmission/reception circuit 40A includes oscillation circuits 43 and 44, a rectifier circuit 45, and an A/D conversion circuit 46. The oscillation circuit 43 causes an oscillating current to flow in the coil 11 in accordance with control of the CPU 59. The oscillation circuit 44 causes an oscillating current to flow in the coil 12 in accordance with control of the CPU 59.

The oscillating currents help the coils 11 and 12 to generate high frequency magnetic fields. When the detection object 700 gets close to the high frequency magnetic fields, a eddy current flows in the detection object 700 due to electromagnetic induction. The eddy current changes impedance of the coils 11 and 12 and stops the oscillation. A voltage signal in accordance with the change of the impedance of the coils is rectified by the rectifier circuit 45, and then the A/D conversion circuit 46 converts the signal into a digital signal. The CPU 59 determines presence of the detection object 700 on the basis of the digital signal.

The control unit 50 of the proximity sensor 2 (i) extracts a first component caused by a mounting metal fitting 800 and a second component caused by the detection object 700 from detection results of the coils 11 and 12, (ii) compensates the second component using the first component, and (iii) senses the presence or position of the detection object 700 on the basis of the compensated second component as in the first embodiment.

Thus, the configuration in which the oscillation proximity sensor 2 is used also can reduce influence of the mounting metal fitting 800, like the proximity sensor 1.

Note that, since the proximity sensor 2 is an oscillation type, amplitude corresponds to a component that is easily affected by a distance to the detection object 700, and phase or frequency correspond to a component that is easily affected by a material of the detection object 700.

Third Embodiment

In the present embodiment, another use method of the time series data D11 (refer to FIG. 11) will be described. Specifically, a configuration in which the control unit of the proximity sensor 1 is caused to have a function for adjusting a performance of the proximity sensor 1 during production will be descried. Note that this configuration can also be applied to the proximity sensor 2 of the second embodiment.

Figure 25:
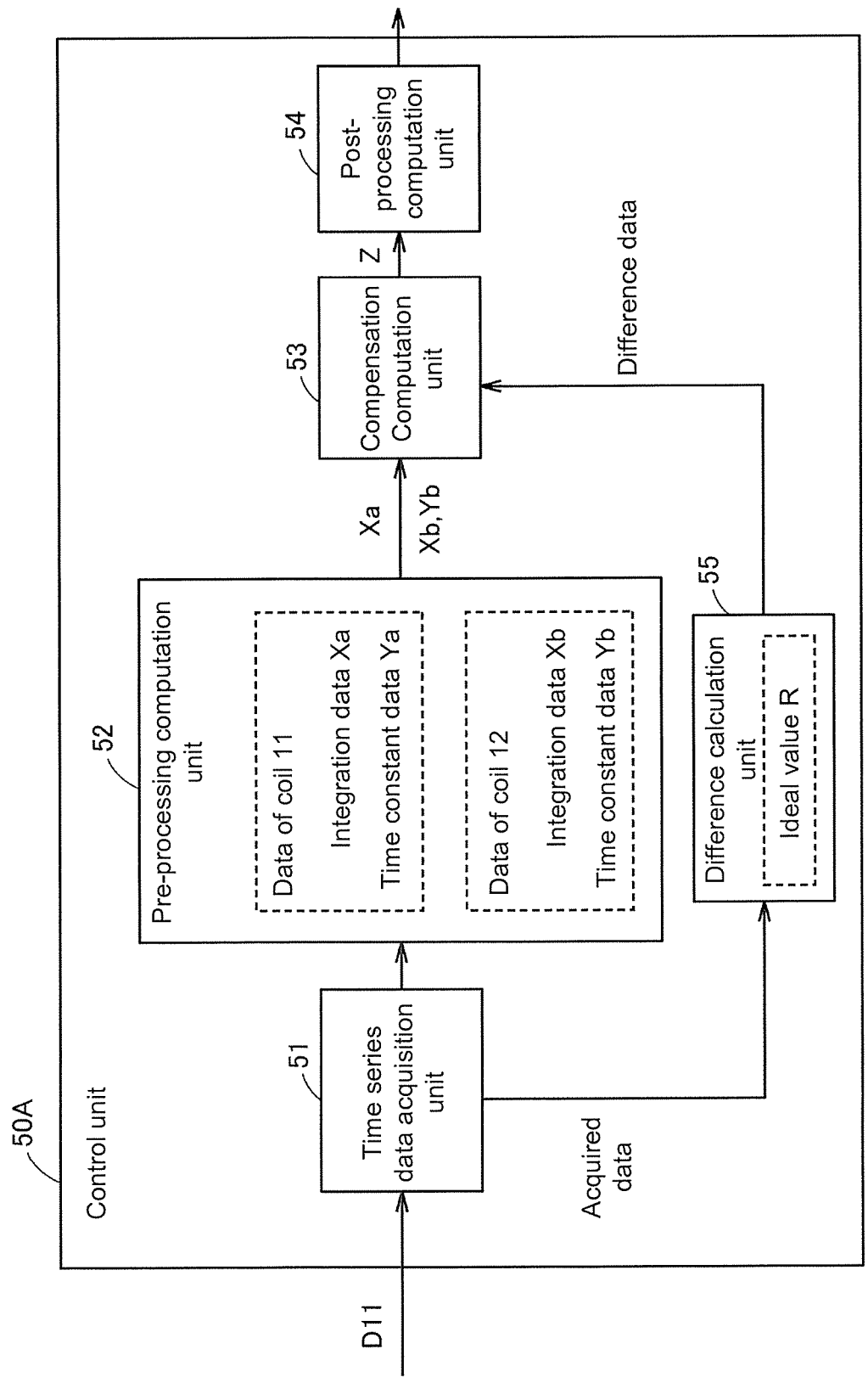
FIG. 25 is a diagram showing a functional configuration of a control unit.

FIG. 25 is a diagram showing a functional configuration of a control unit 50A according to the present embodiment. Referring to FIG. 25, the control unit 50A includes a time series data acquisition unit 51, a pre-processing computation unit 52, a compensation computation unit 53, a post-processing computation unit 54, and a difference calculation unit 55. The control unit 50A is different from the control unit 50 (refer to FIG. 12) of the first embodiment in that the difference calculation unit 55 is further provided.

When a detection distance is adjusted for each proximity sensor 1, acquired data of the proximity sensor 1 is compared with a value corresponding to an ideal threshold curve (an ideal value R) of the control unit 50, and the difference thereof is set to a correction value for unevenness in performances of individual coils. The difference is calculated by the difference calculation unit 55.

The control unit 50 decides the correction value such that a shape of a data space is the same as the ideal value, and thus not only inductance values of the coils 11 and 12 but also unevenness in assembly positions of components can be corrected together. Furthermore, correction accuracy can be improved by comparing a plurality of distance adjustment points.

When a plurality of coils are mounted in the proximity sensor 1, normally, it is very difficult to adjust assembly positions of the coils. It therefore seriously affects productivity. However, according to an adjustment method of the present embodiment, tolerance of accuracy in position assembly positions increases, and as a result, productivity of the proximity sensor 1 can be improved.

All embodiments disclosed herein are merely examples and are not limitative. The scope of the present disclosure is defined by the claims, not the above-described embodiments, and includes meanings equivalent to the claims and all kinds of modifications made within the claims.

What is claimed is:

1. A proximity sensor that senses the presence or position of a detection object by using magnetic field in a state in which the proximity sensor is mounted on a support member using a mounting metal fitting, the proximity sensor comprising:
    a plurality of detection coils for generating the magnetic field;
    a transmission circuit that supplies a current to each of the detection coils;
    a reception circuit comprising a plurality of processing systems each corresponds to a different one of the detection coils as each of the detection coils acquires and detects voltages generated at both ends of each of the detection coils or currents flowing in each of the detection coils;
    a control unit that senses the presence or position of the detection object using a detection result of the reception circuit; and
    an output unit that outputs a sensing result of the control unit,
    wherein the control unit extracts a first component caused by the mounting metal fitting and a second component caused by the detection object from the detection result of the reception circuit, compensates the second component by using the first component, and senses the presence or position of the detection object on the basis of the compensated second component
    wherein the plurality of detection coils include a first detection coil and a second detection coil, a diameter of the second detection coil is greater than a diameter of the first detection coil and the first detection coil is installed in an inner region of the second detection coil.

2. The proximity sensor according to claim 1, wherein the control unit compensates the second component by subtracting the first component from the second component.

3. The proximity sensor according to claim 1, wherein the reception circuit detects the voltages or the currents for each of the detection coils individually.

4. The proximity sensor according to claim 2, wherein the reception circuit detects the voltages or the currents for each of the detection coils individually.

5. The proximity sensor according to claim 3, wherein the reception circuit detects the voltages or the currents from each of the detection coils at different timings in a time dividing manner.

6. The proximity sensor according to claim 1, wherein the transmission circuit includes an excitation circuit for periodically supplying a pulsed exciting current to each of the detection coils, the second component is an integration value of transient currents generated at both ends of the first detection coil, and the first component is a value based on an integration value of transient currents generated at both ends of the second detection coil and time constant information of transient currents generated at both ends of the second detection coil.

7. The proximity sensor according to claim 2, wherein the transmission circuit includes an excitation circuit for periodically supplying a pulsed exciting current to each of the detection coils, the second component is an integration value of transient currents generated at both ends of the first detection coil, and the first component is a value based on an integration value of transient currents generated at both ends of the second detection coil and time constant information of transient currents generated at both ends of the second detection coil.

8. The proximity sensor according to claim 3, wherein the transmission circuit includes an excitation circuit for periodically supplying a pulsed exciting current to each of the detection coils, the second component is an integration value of transient currents generated at both ends of the first detection coil, and the first component is a value based on an integration value of transient currents generated at both ends of the second detection coil and time constant information of transient currents generated at both ends of the second detection coil.

9. The proximity sensor according to claim 5, wherein the transmission circuit includes an excitation circuit for periodically supplying a pulsed exciting current to each of the detection coils, the second component is an integration value of transient currents generated at both ends of the first detection coil, and the first component is a value based on an integration value of transient currents generated at both ends of the second detection coil and time constant information of transient currents generated at both ends of the second detection coil.

10. The proximity sensor according to claim 1, wherein the transmission circuit includes an excitation circuit for periodically supplying a pulsed exciting current to each of the detection coils, the second component is an integration value of transient currents generated at both ends of the first detection coil, and the first component is a value based on an integration value of transient currents generated at both ends of the second detection coil and time constant information of transient currents generated at both ends of the second detection coil.

11. The proximity sensor according to claim 6, wherein the first detection coil and the second detection coil are annular coils.

12. A method executed by a proximity sensor that senses the presence or position of a detection object by using magnetic field, the method comprising:
    a step of supplying currents to a plurality of detection coils for generating the magnetic field;
    a step of detecting voltages generated at both ends of the detection coils or currents flowing in the detection coils due to the supply of the currents for each of the detection coils;

a step of sensing the presence or position of the detection object by using a detection result obtained in the step of detection; and a step of outputting a sensing result obtained in the step of sensing, wherein the step of sensing the presence or position of the detection object includes:

a step of extracting a first component caused by a mounting metal fitting for mounting the proximity sensor on a support member and a second component caused by the detection object from the detection result obtained in the step of detection, a step of compensating the second component by using the first component, a step of sensing the presence or position of the detection object on the basis of the compensated second component; and a step of acquiring the voltages or the currents from each of the detection coils by a plurality of processing systems, wherein each of the processing systems corresponds to a different one of the detection coils, wherein the plurality of detection coils include a first detection coil and a second detection coil, a diameter of the second detection coil is greater than a diameter of the first detection coil and the first detection coil is installed in an inner region of the second detection coil.

* * * * *